(12) United States Patent
Kim et al.

(10) Patent No.: US 11,652,104 B2
(45) Date of Patent: May 16, 2023

(54) SEMICONDUCTOR DEVICE AND METHOD OF MANUFACTURING THE SAME

(71) Applicant: Samsung Electronics Co., Ltd., Suwon-si (KR)

(72) Inventors: Dong Hyun Kim, Hwaseong-si (KR); Sung Chul Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 357 days.

(21) Appl. No.: 16/410,132

(22) Filed: May 13, 2019

(65) Prior Publication Data

US 2020/0083222 A1    Mar. 12, 2020

(30) Foreign Application Priority Data

Sep. 11, 2018    (KR) .................. 10-2018-0108143

(51) Int. Cl.
*H01L 27/092*    (2006.01)
*H01L 29/06*     (2006.01)
*H01L 29/78*     (2006.01)

(52) U.S. Cl.
CPC ...... *H01L 27/0924* (2013.01); *H01L 29/0653* (2013.01); *H01L 29/785* (2013.01)

(58) Field of Classification Search
CPC ............ H01L 27/0924; H01L 29/0653; H01L 29/785; H01L 21/823821; H01L 29/66545; H01L 27/0886; H01L 21/823431; H01L 29/7855
See application file for complete search history.

(56) References Cited

U.S. PATENT DOCUMENTS

| | | | |
|---|---|---|---|
| 9,064,932 B1 * | 6/2015 | Pham | H01L 29/66545 |
| 9,601,492 B1 | 3/2017 | Deng et al. | |
| 9,761,495 B1 | 9/2017 | Xie et al. | |
| 9,831,306 B2 | 11/2017 | Webb et al. | |
| 9,917,085 B2 | 3/2018 | Lin et al. | |
| 9,929,157 B1 | 3/2018 | Xie et al. | |
| 9,935,017 B2 | 4/2018 | You et al. | |
| 2016/0181425 A1 * | 6/2016 | Bai | H01L 29/7848 |
| | | | 438/283 |
| 2016/0233298 A1 | 8/2016 | Webb et al. | |
| 2017/0222020 A1 | 8/2017 | Yu et al. | |
| 2017/0256457 A1 | 9/2017 | Deng et al. | |
| 2017/0345820 A1 * | 11/2017 | Lin | H01L 29/66818 |
| 2017/0345913 A1 | 11/2017 | Dai et al. | |
| 2019/0157387 A1 * | 5/2019 | Wu | H01L 29/0847 |

* cited by examiner

*Primary Examiner* — Hoang-Quan Ho
(74) *Attorney, Agent, or Firm* — Harness, Dickey & Pierce, P.L.C.

(57) ABSTRACT

A semiconductor device including a substrate having a plurality of active fins, each of the plurality of active fins extending in a first direction, first and second gate structures crossing over the plurality of active fins, the first and second gate structures extending in a second direction different from the first direction, the first and second gate structures spaced apart from each other in the first direction, at least one insulating barrier extending in the first direction and between the plurality of active fins, the insulating barrier separating lower portions of the first and second gate structures from each other, and a gate isolation layer connected to a portion of the insulating barrier, the gate isolation unit separating upper portions of the first and second gate structures from each other may be provided.

17 Claims, 30 Drawing Sheets

III-III'

III-III'

IVA-IVA'

XVA-XVA'

XVB-XVB'

XXII-XXII'

SEMICONDUCTOR DEVICE AND METHOD OF MANUFACTURING THE SAME

CROSS-REFERENCE TO RELATED APPLICATION(S)

This application claims benefit of priority to Korean Patent Application No. 10-2018-0108143 filed on Sep. 11, 2018 in the Korean Intellectual Property Office, the disclosure of which is incorporated herein by reference in its entirety.

BACKGROUND

1. Field

The present inventive concepts relate to semiconductor devices and/or methods of manufacturing the same.

2. Description of Related Art

As demand for higher performance, faster speed and/or multi-functionality of semiconductor devices, or the like, increases, a degree of integration of semiconductor devices tends to increase. In manufacturing such highly-integrated semiconductor devices, patterns having a fine width or a fine separation distance are desired to be implemented. Further, as the semiconductor devices become more highly integrated, a planar metal oxide semiconductor FET (MOSFET) tends to be replaced by a FinFET having a channel with a three-dimensional (3D) structure.

SUMMARY

At least one or more aspects of the present inventive concepts is to provide semiconductor devices and/or manufacturing methods of the semiconductor device, in which a degree of integration is improved.

According to an example embodiment, a semiconductor device includes a substrate having a plurality of active fins, each of the plurality of active fins extending in a first direction, first and second gate structures crossing over the plurality of active fins, the first and second gate structures extending in a second direction different from the first direction, the first and second gate structures spaced apart from each other in the first direction, at least one insulating barrier extending in the first direction and between the plurality of active fins, the insulating barrier separating lower portions of the first and second gate structures from each other, and a gate isolation layer connected to a portion of the insulating barrier, the gate isolation layer separating upper portions of the first and second gate structures from each other.

According to an example embodiment, a semiconductor device includes a substrate having a plurality of active fins each extending in a first direction, the plurality of active fins arranged at a first interval or a second interval, the second interval being greater than the first interval, first and second gate structures crossing over the plurality of active fins and extending in a second direction that is different from the first direction, the first and second gate structures being spaced apart from each other in the first direction, at least one insulating barrier between neighboring two of the plurality of active fins that are arranged at the second interval, the insulating barrier extending in the first direction and between the first and second gate structures, and a gate isolation layer on a portion of an upper surface of the insulating barrier and between the first and second gate structures.

According to an example embodiment, a semiconductor device includes a substrate having a plurality of active fins, each of the plurality of active fins extending in a first direction, first and second gate structures crossing over the plurality of active fins and extending in a second direction that is different from the first direction, and a gate cut structure between the first and second gate structures such that the first and second structures are separated, the gate cut structure including an insulating barrier extending in the first direction between the plurality of active fins and a gate isolation layer being on a portion of an upper surface of the insulating barrier.

According to an example embodiment, a method of manufacturing a semiconductor device includes forming a plurality of active fins extending in a first direction on a substrate, the plurality of active fins having a structure protruding above an device isolation layer, forming a first dummy gate material layer on the device isolation layer to cover the plurality of active fins, removing some of the first dummy gate material layer between the plurality of active fins to expose a portion of the device isolation layer, an exposed portion of the device isolation layer defining a bottom surface of a space surrounded by the first dummy gate material layer, forming an insulating barrier on the exposed portion of the device isolation layer such that the space surrounded by the first dummy gate material layer is filled, forming a second dummy gate material layer on the first dummy gate material layer, forming at least one dummy gate pattern by patterning the first dummy gate material layer and the second dummy gate material layer, forming an isolation hole in a portion of the dummy gate pattern such that the dummy gate pattern is separated into two portions and a portion of the insulating barrier is exposed via the isolation hole, and forming a gate isolation layer in the isolation hole of the dummy gate pattern.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
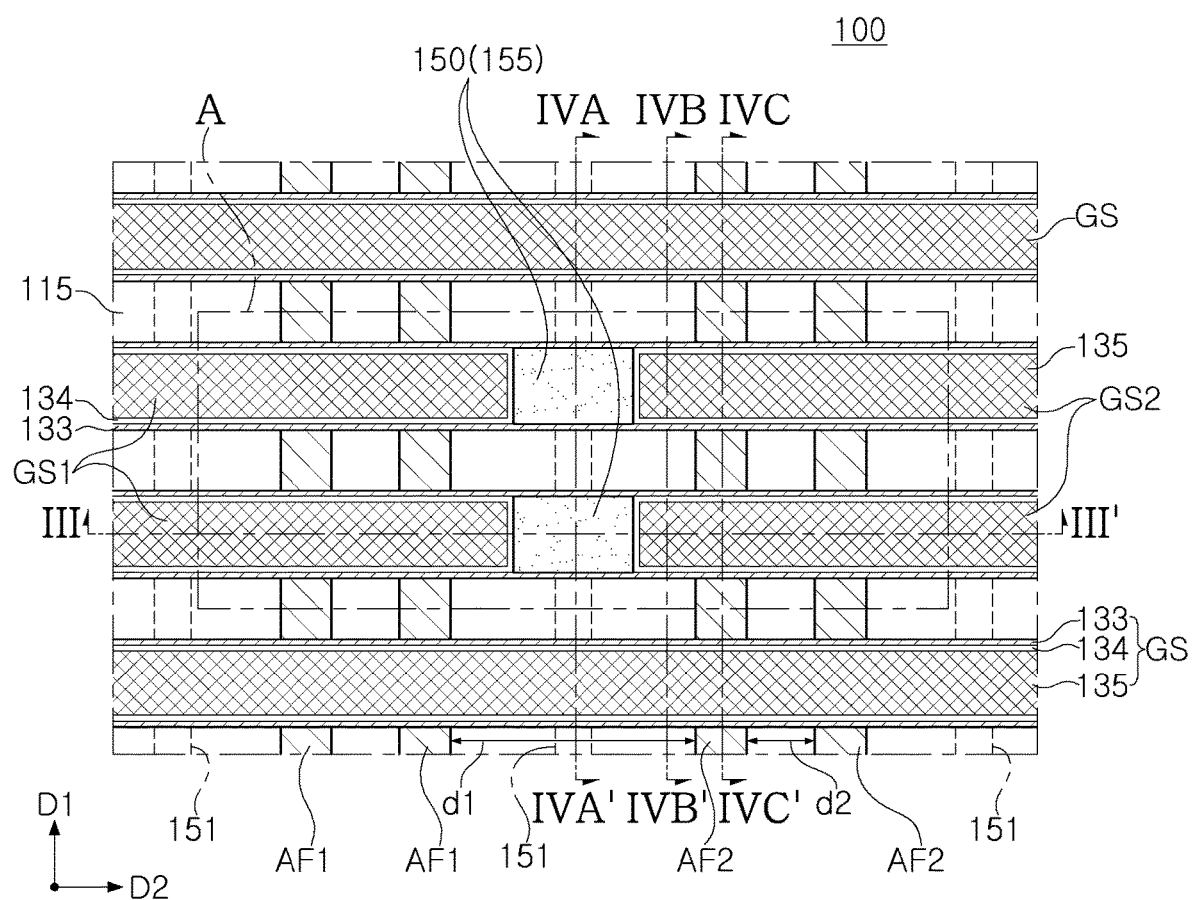
FIG. 1 is a plan view illustrating a semiconductor device, according to an example embodiment.
Figure 2:
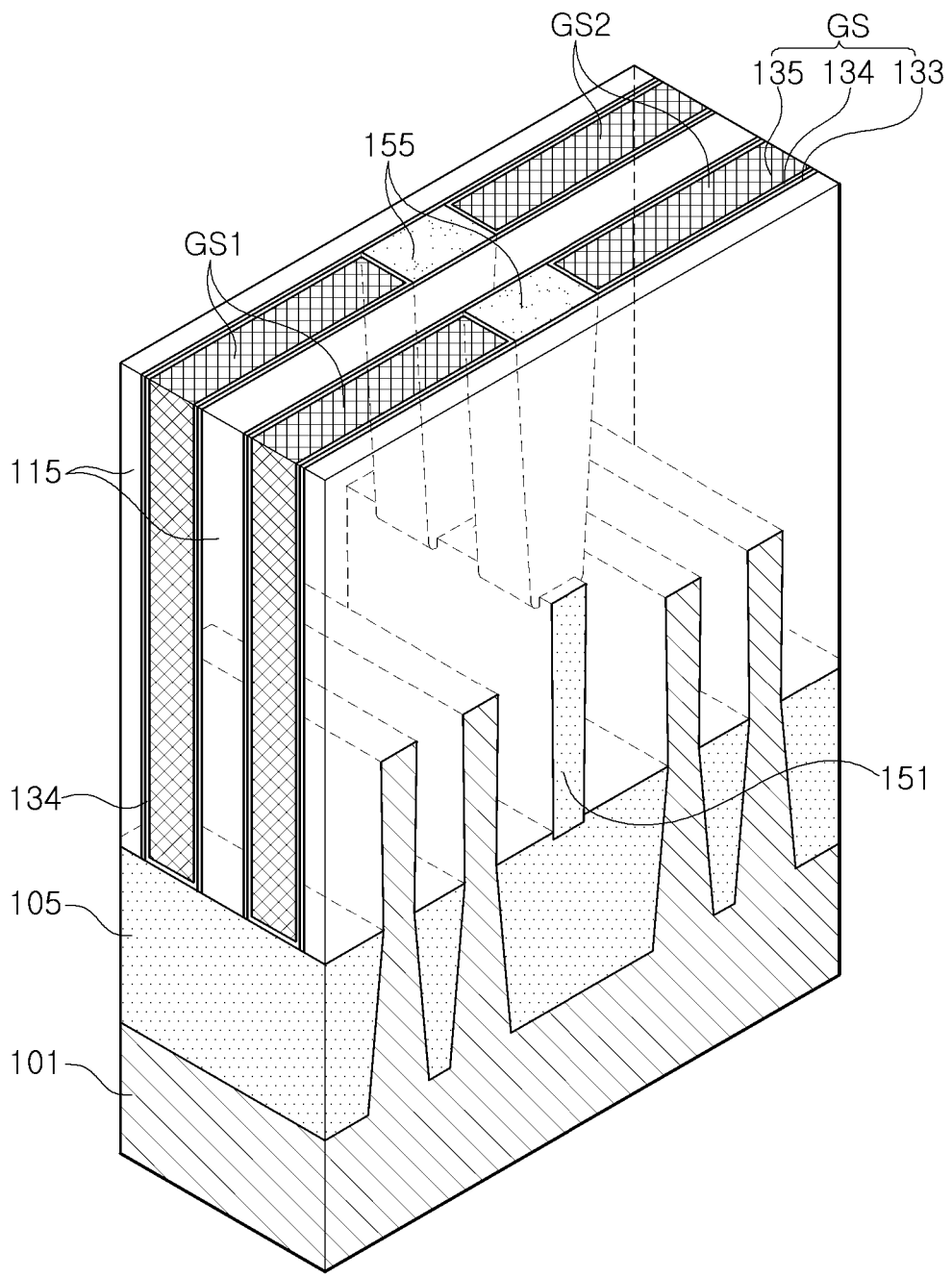
FIG. 2 is a partial perspective view illustrating portion II of the semiconductor device illustrated in FIG. 1.

FIG. 1 is a plan view illustrating a semiconductor device, according to an example embodiment, and FIG. 2 is a partial perspective view illustration portion II of the semiconductor device illustrated in FIG. 1.

Referring to FIGS. 1 and 2, a semiconductor device 100 according to an example embodiment may include a substrate 101, and a device isolation layer 105 disposed on the substrate 101, and first and second active fins AF1 and AF2 disposed on the substrate 101 and protruding above the device isolation layer 105.

The substrate 101 may include a semiconductor material (e.g., a Group IV semiconductor, a Group III-V compound semiconductor, or a Group II-VI oxide semiconductor). For example, a Group IV semiconductor may include silicon, germanium or silicon-germanium. The substrate 101 may be provided as a bulk wafer, an epitaxial layer, a silicon-on-insulator (SOI) layer, a semiconductor on insulator (SOI) layer, or the like.

The substrate 101 may include an active area, and the first and second active fins AF1 and AF2 may be formed on the active area. For example, the first and second active fins AF1 and AF2 may be formed in an n-type well for a P-MOS transistor or in a p-type well for an N-MOS transistor.

The device isolation layer 105 may define the active area, on which the first and second active fins AF1 and AF2 are formed, on the substrate 101. The device isolation layer 105 may be formed, for example, by a shallow trench isolation STI process. According to some example embodiments, the device isolation layer 105 may include an area extending deeper into a lower portion of the substrate 101 between the first and second active fins AF1 and AF2. The device isolation layer 105 may have a curved upper surface, but shapes of the upper surface of the device isolation layer 105 are not limited thereto. The device isolation layer 105 may be made of an insulating material. For example, the device isolation layer 105 may include oxide, nitride, or a combination thereof.

The first and second active fins AF1 and AF2 may extend in a first direction D1 and may be arranged in a second direction D2 which intersects the first direction D1. The first and second active fins AF1 and AF2 may be provided as the active area (e.g., a source, a channel, and a drain) of the transistor.

As shown in FIG. 1, the first and second active fins AF1 and AF2 each are illustrated as including two active fins, but are not limited thereto, and in some example embodiments, may be provided as one active fin or three or more active fins.

The plurality of gate structures GS may cross over the first and second active fins AF1 and AF2. The plurality of gate structures GS may extend in a second direction y, respectively, and may be arranged in the first direction D1.

Figure 4A:
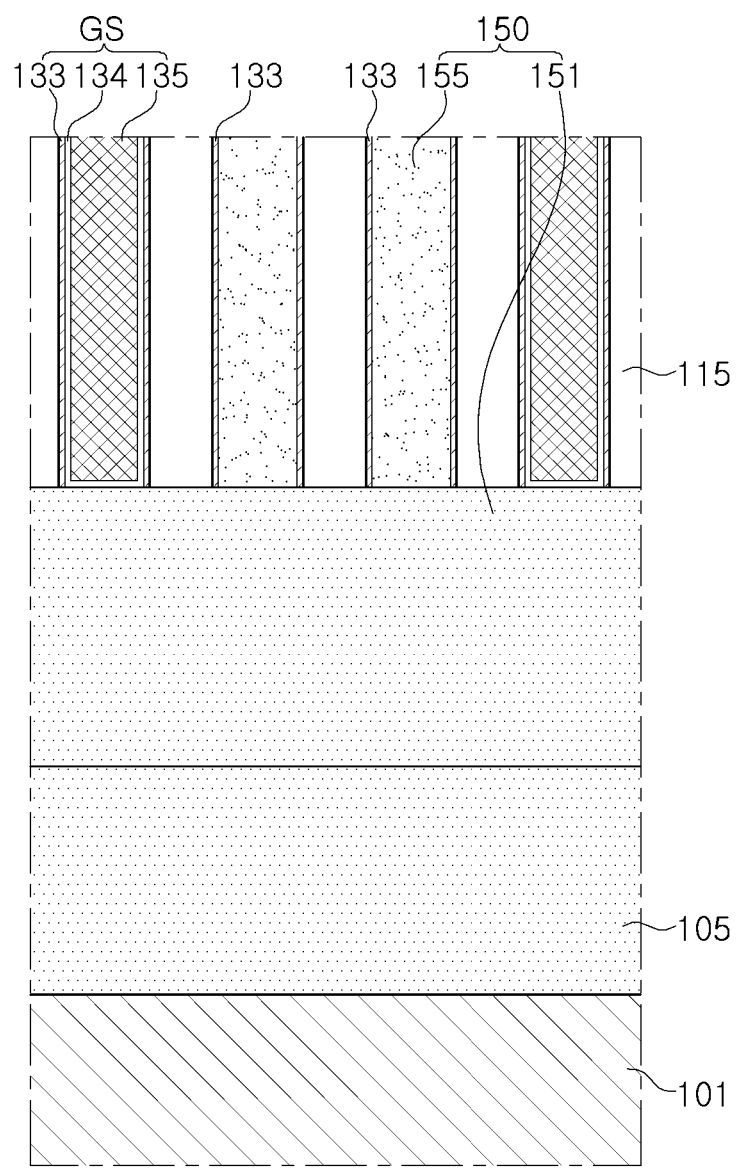
FIGS. 4A to 4C are cross-sectional views taken along line IVA-IVA', line IVB-IVB' and line IVC-IVC', respectively, of the semiconductor device illustrated in FIG. 1.
Figure 4B:
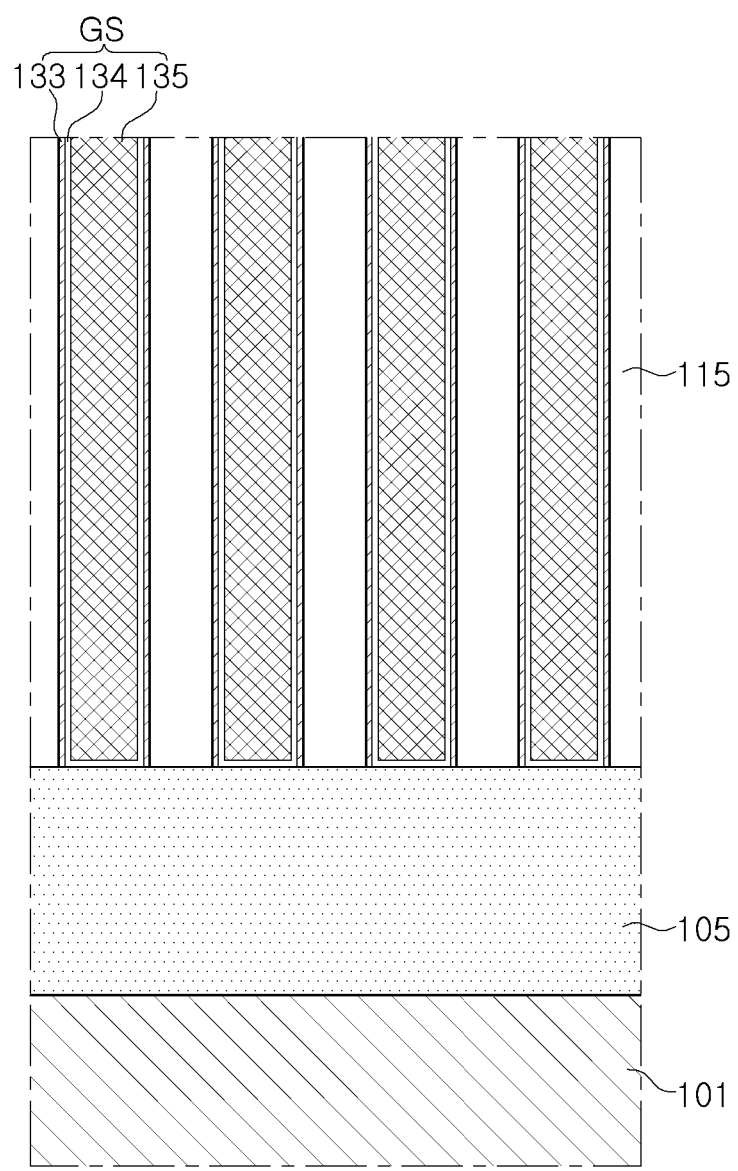
Figure 4C:
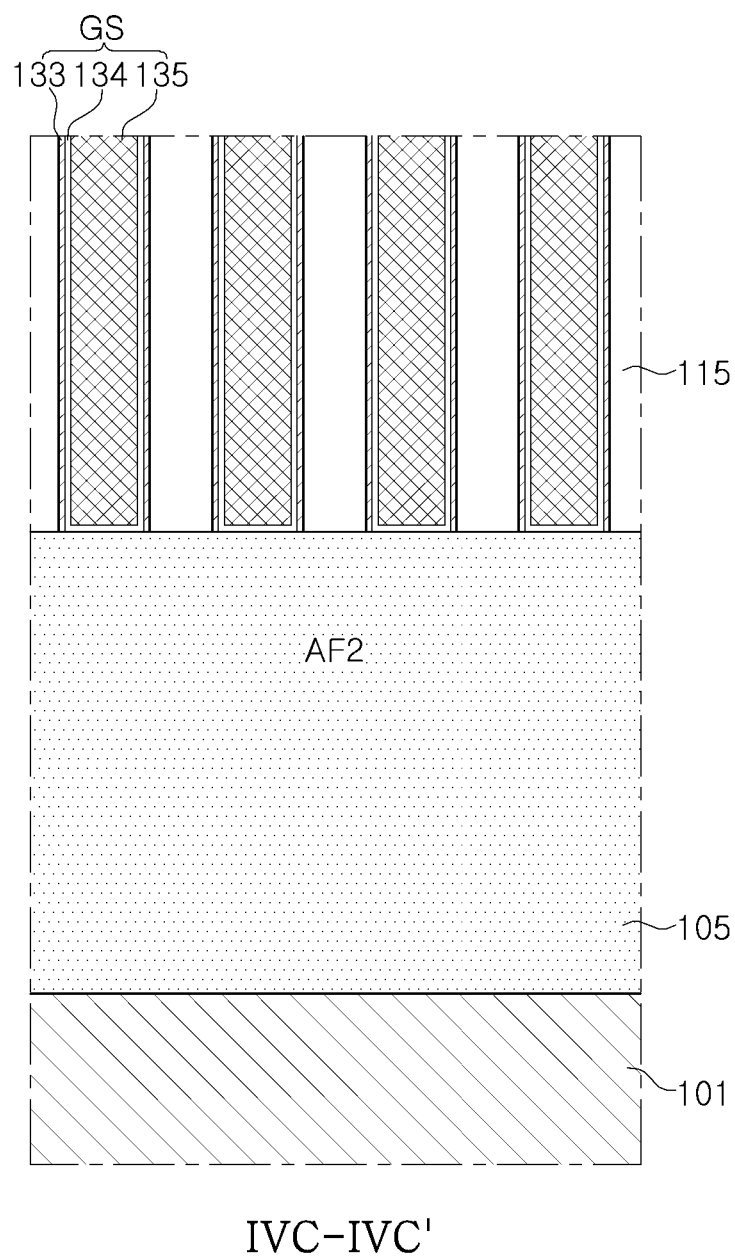

FIGS. 4A to 4C are cross-sectional views taken along line IVA-IVA', line IVB-IVB', and line IVB-IVB' of the semiconductor device illustrated in FIG. 1, respectively.

As illustrated in FIG. 4A to 4C, the gate structure GS may include a sidewall spacer 133, a gate dielectric layer 134 and a gate electrode 135 disposed between the sidewall spacers 133. In some example embodiments, the gate structure GS may further include a gate capping layer on the gate dielectric layer 134 and the gate electrode 135.

The gate electrode 135 may include a conductive material, for example, a metal nitride (e.g., a titanium nitride film TiN, a tantalum nitride film TaN, or a tungsten nitride film WN), and/or a metal material (e.g., aluminum Al, tungsten W, or molybdenum Mo), or a semiconductor material (e.g., a doped polysilicon). In some example embodiments, the gate electrodes 135 may comprise two or more multilayer structures.

The gate capping layer may be formed in an area in which a portion of the gate dielectric film 134 and the gate electrode 135 is etched-back. For example, the gate capping layer may be an insulating material such as silicon nitride.

The sidewall spacer 133 may be formed of, for example, an insulating material (e.g., SiOCN, SiON, SiCN, or SiN). The gate dielectric film 134 may include a silicon oxide film, a silicon oxynitride film, or a high dielectric constant film having a dielectric constant higher than silicon oxide. The high dielectric constant material may mean a dielectric material having a dielectric constant higher than that of the silicon oxide $SiO_2$. For example, the high dielectric constant material may be at least one of aluminum oxide $Al_2O_3$, tantalum oxide $Ta_2O_3$, titanium oxide TiO2, yttrium oxide $Y_2O_3$, zirconium oxide ZrO2, zirconium silicon oxide $ZrSi_xO_y$, hafnium oxide $HfO_2$, hafnium silicon oxide HfSixOy, lanthanum oxide $La_2O_3$, lanthanum aluminum oxide LaAlxOy, lanthanum hafnium oxide LaHfxOy, hafnium aluminum oxide HfAlxOy, or praseodymium oxide Pr2O3.

An interlayer insulating layer 115 may be disposed between the plurality of gate structures GS while covering the device isolation layer 105 and the first and second active fins AF1 and AF2. An additional interlayer (not shown) insulating layer may be disposed to cover the plurality of gate structures GS. For example, the interlayer insulating layer 115 may be at least one of oxide, nitride, or oxynitride, or may include a material having a low dielectric constant than silicon oxide.

Some gate structures GS may be divided into a plurality of portions by the gate cut structure 150. As illustrated in FIGS. 1 and 2, in the present example embodiment, two gate structures GS each may be separated into the first and second gate structures GS1 and GS2 by the gate cut structure 150 in the second direction D2. The first and second gate structures GS1 and GS2 may extend and may be arranged in the second direction D2.

As in the present example embodiment, two or more gate cut structures 150 may be formed in the first direction over two or more adjacent gate structures GS, respectively. Accordingly, a plurality of (for example, two) gate structures GS may be separated in the second direction D2. In some example embodiments, the gate cut structure 150 may be provided to separate only one gate structure GS.

Figure 3:
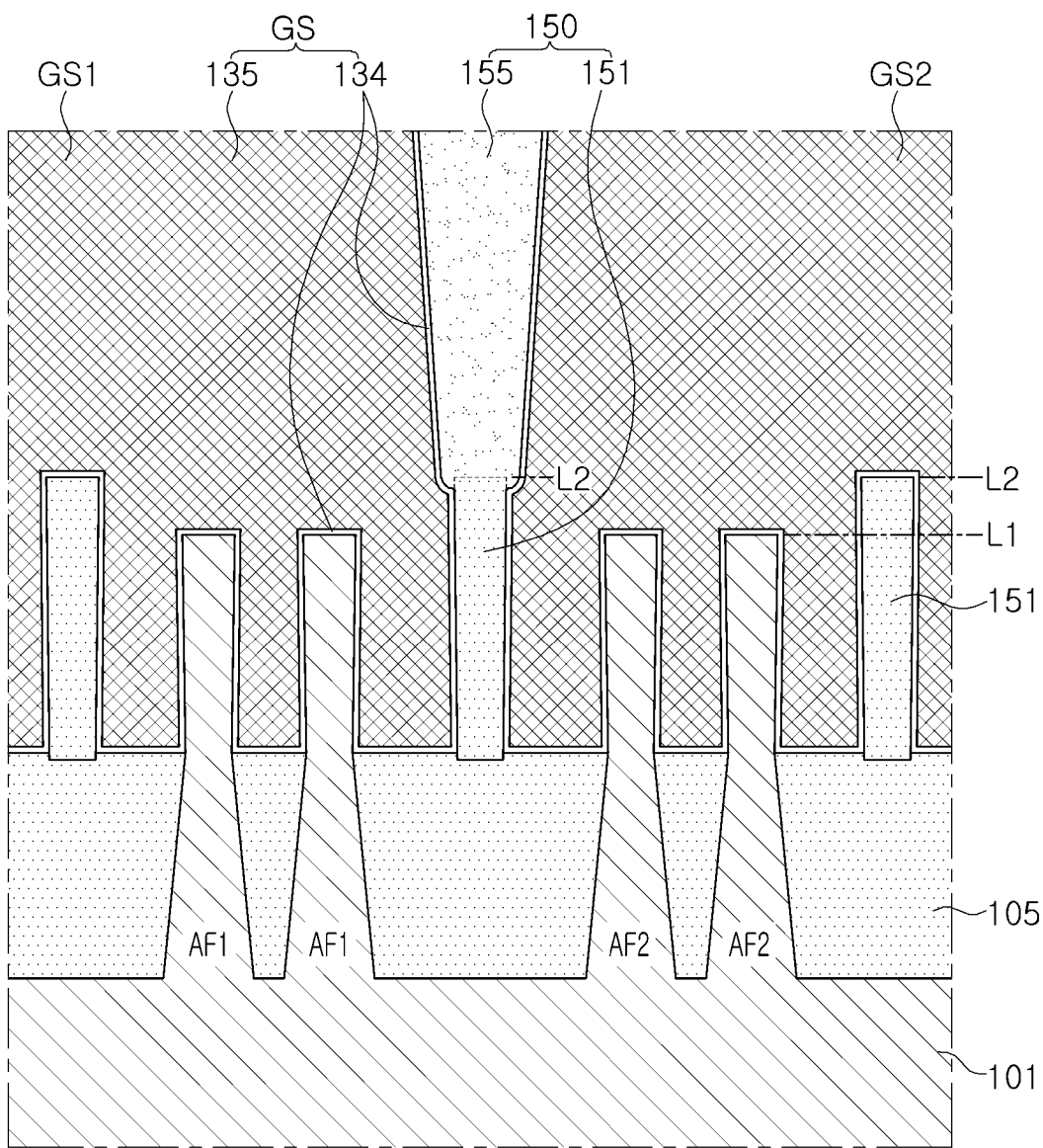
FIG. 3 is a cross-sectional view taken along line III-III' of the semiconductor device illustrated in FIG. 1.

The gate cut structure 150 employed in the present example embodiment includes a two-story insulation structure separating the first and second gate structures GS1 and GS2. FIG. 3 is a cross-sectional view taken along line of the semiconductor device illustrated in FIG. 1, and illustrates a two-story gate cut structure employed in the present example embodiment.

Referring to FIG. 3, together with FIG. 2, the gate cut structure 150 includes an insulating barrier 151 disposed between the first and second active fins AF1 and AF2 and a gate isolation layer 155 disposed on a portion of an upper surface of the insulating barrier 151.

The insulating barrier 151 and the gate isolation layer 155 are formed by different processes (referring to FIG. 7 to FIG. 11) at different stages, and thus, may have different shapes.

As illustrated in FIGS. 1 and 2, the insulating barrier 151 may have a structure extending in the first direction D1 between the first and second active fins AF1 and AF2. The insulating barrier 151 may extend to a length substantially corresponding to an extended length of the adjacent active fins AF1 and AF2. The insulating barrier 151 may have a shape similar to the first or second active fins AF1 and AF2.

It should be noted that the insulating barrier 151 may also be located in areas other than a desired (or alternatively, predetermined) gate cut area. For example, as illustrated in FIG. 2, the insulating barrier 151 may include portions connected to the gate isolation layer 155 in the desired (or alternatively, predetermined) gate cut area, and the insulating barrier 151 may also include other portions extending in the first direction D1 without being connected to the gate isolation layer 155.

Further, referring to FIGS. 1 and 3, the insulating barrier 151 may be additionally provided in an area between other active fins AF1 and/or AF2 in which the gate isolation layer 155 is not provided. It can be understood that this insulating barrier 151 is provided only as a dummy element.

A height L2 of the insulating barrier 151 may be greater than a height L1 of the first and second active fins AF1 and AF2. In this specification, the height comparison may be described based on a level of an upper surface of each configuration rather than a height of each configuration itself. The plurality of insulating barriers 151 disposed between the other active fins AF1 and AF2 may also have a height that is the same as or substantially similar to the height L2 (referring to FIG. 3). For example, the upper surfaces of the plurality of insulating barriers 151 may be obtained through a polishing process.

The insulating barrier 151 may not be provided in an area at which an interval between the active fins is smaller than an arbitrary interval (or a threshold interval). As illustrated in FIGS. 1 to 3, the insulating barrier 151 may not be disposed between some active fins (e.g., between some of the first active fins AF1 and between some of the second active fins AF2). For example, an insulating barrier 151 may not be formed between certain active fins that are arranged at the smallest interval from among the plurality of different intervals. In some example embodiments, adjacent active fins AF1 and/or AF2 that are not separated by the insulating barrier 151 may be connected by an epitaxial regrowth layer to provide one common source or one common drain.

Referring to FIG. 1 to FIG. 3, the gate isolation layer 155 may be disposed to be connected to a portion of the insulating barrier 151. The insulating barrier 151 separates lower portions of the first and second gate structures GS1 and GS2, and the gate isolation layer 155 separates upper portions of the first and second gate structures GS1 and GS2.

The gate isolation layer 155 may be formed before completing the gate structures GS. For example, prior to performing a replacement process for forming the gate structure GS, a dummy gate layer (for example, polysilicon), located in the gate isolation area may be removed and the removed area may be filled with an insulating material, thereby forming the gate isolation layer 155 (referring to FIGS. 23A and 23B).

In the present example embodiment, the gate isolation layer 155 may be formed at the upper surface of the insulating barrier 151 to form a desired gate cut structure 150. Because the gate isolation layer 155 does not have to be formed deeply so that the gate isolation layer 155 touches the device isolation layer 105, limitations of a photolithography and an etching process that are caused by a failure to completely remove the dummy gate material may be overcome, and variations of a threshold voltage Vth may be prevented or mitigated.

As described above, each of the gate structures GS may include a gate dielectric film 134 disposed on a portion of the first and second active fins AF1 and AF2 and a gate electrode 135 disposed on the gate dielectric film 134.

As illustrated in FIG. 3, the gate dielectric film 134 may extend to a side surface of the insulating barrier 151 and a side surface of the gate isolation layer 155 that are in contact with the gate electrode 135 (observed in a cross-section along line III-III').

Further, as illustrated in FIG. 4A, the gate structure GS may further include a gate spacer 133 disposed on both side surfaces, which are its extended side surfaces, and the gate spacer 133 may extend to the other side surface of the gate isolation layer 155 contacting the gate electrode 135, in other words, a side surface not in contact with the gate electrode 135 (observed in a cross-section along line IVA-IVA'). The gate spacer 133 is not formed on the surface of the insulating barrier 151.

Figure 5:
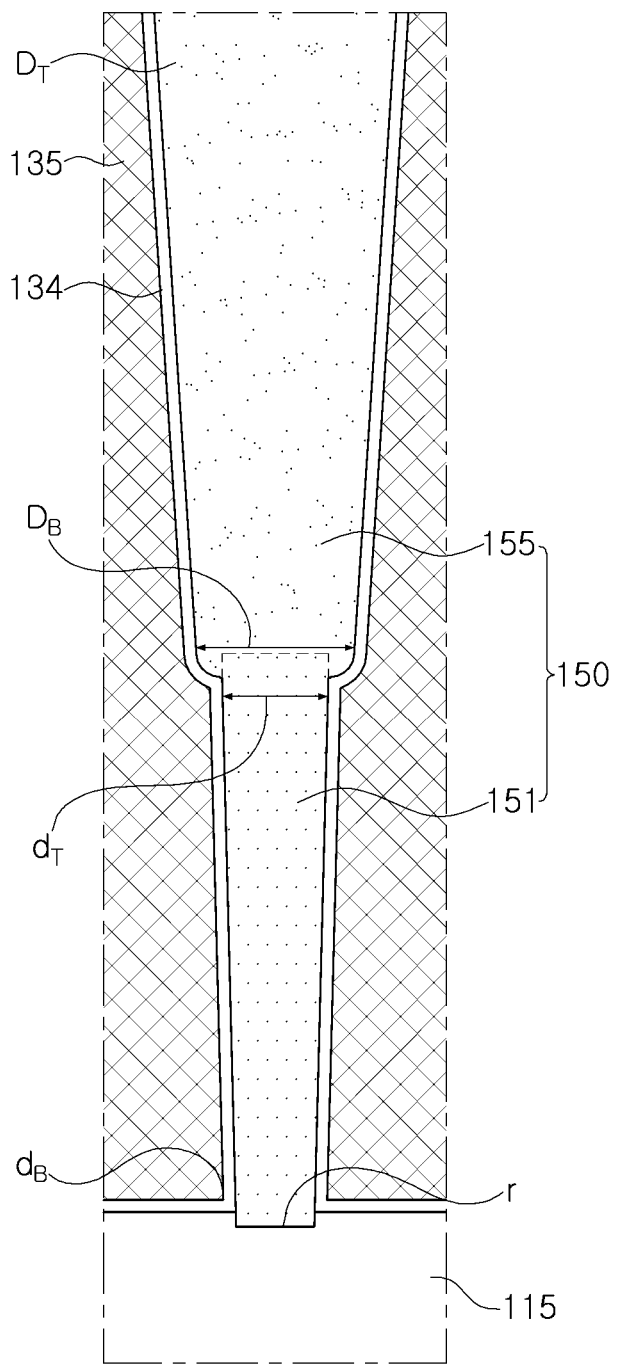
FIG. 5 is an enlarged view of a two-story gate cut structure for the semiconductor device illustrated in FIG. 2, according to some example embodiments.

FIG. 5, an enlarged view of the two-story gate cut structure 150 for the semiconductor device illustrated in FIG. 2, according to an example embodiment.

Referring to FIG. 5, the gate cut structure 150 includes an insulating barrier 151 separating lower portions of the first and second gate structures GS1 and GS2 from each other as described above, and a gate isolation layer 155 connected to a portion of the insulating barrier 151 and separating upper portions of the first and second gate structures GS1 and GS2 from each other.

The insulating barrier 151 and the gate isolation layer 155 may be formed by a series of different processes (a self-alignment process, a photo/etching process) before and after a replacement process (e.g., an replacement poly gate RPG process), thereby having different shapes from each other and having a discontinuous interface therebetween.

Although not limited thereto, a width of the insulating barrier 151 may be smaller than a width of the gate isolation layer 155. For example, a bottom width $d_B$ at a lower end (e.g., a bottom surface) of the gate isolation layer 155 may be greater than a top width $d_T$ at an upper end (e.g., a top surface) of the insulating barrier 151.

The insulating barrier 151 may have a recessed lower portion r in the device isolation layer 105 to ensure complete insulation between the lower portions of the first and second gate structure GS. In the case that the insulating barrier 151 is formed by a self-alignment process, the bottom width $d_B$ of the insulating barrier 151 may be smaller than the top width $d_T$ of the insulating barrier 151. Here, the width of the insulating barrier 151 means a distance in the second direction D2. Further, the bottom width $D_B$ of the gate isolation layer 155 may also be smaller than a top width $D_T$ of the gate isolation layer 155.

Figure 6:
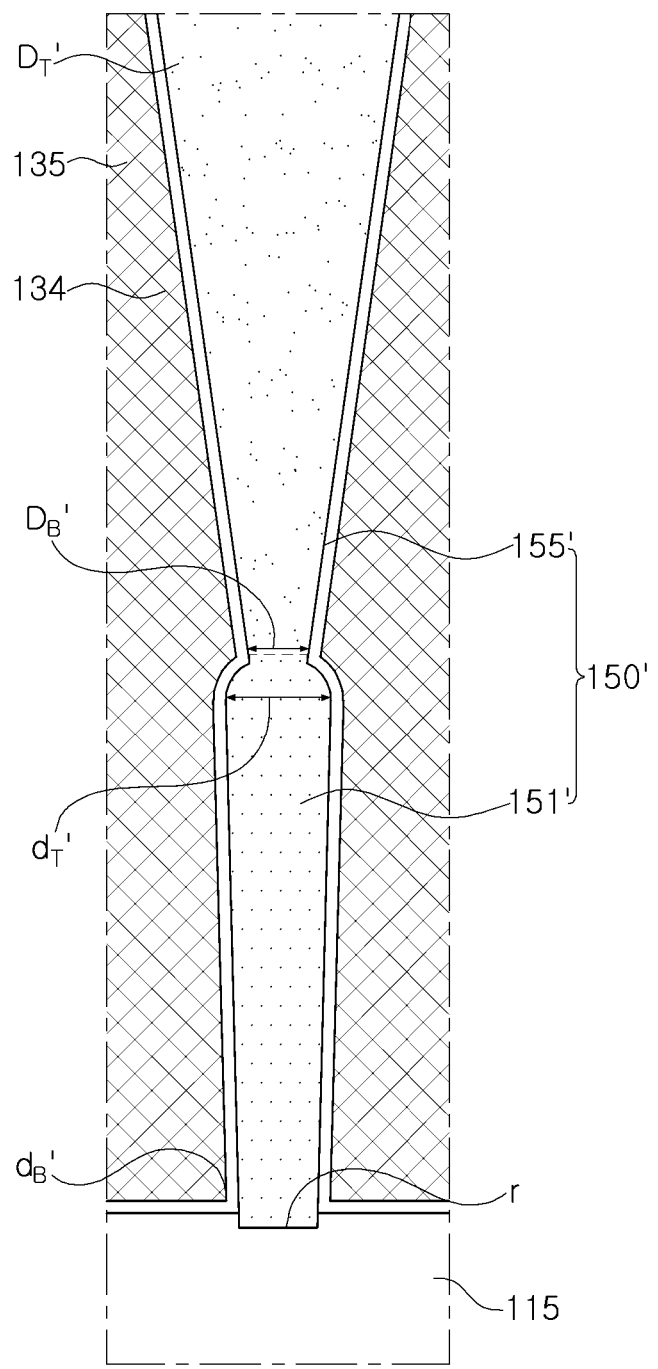
FIG. 6 is a cross-sectional view illustrating a gate cut structure employed in a semiconductor device, according to an example embodiment.

FIG. 6 is a cross-sectional view illustrating a gate cut structure employed in a semiconductor device, according to another example embodiment.

Referring to FIG. 6, a gate cut structure 150' employed in the present example embodiment has a two-story structure similar to the gate cut structure illustrated in FIG. 5. For example, the gate cut structure 150' includes an insulating barrier 151' separating lower portions of the first and second gate structures GS1 and GS2 from each other and a gate isolation layer 155' connected to a portion of the insulating barrier 151' and separating upper portions of the first and second gate structures GS1 and GS2 from each other. A bottom width $D_B'$ of the gate isolation layer 155' may be smaller than a top width $D_T'$ of the gate isolation layer 155'. Further, a bottom width $d_B'$ of the insulating barrier 151' may be smaller than a top width $d_T'$ of the insulating barrier 151'. However, unlike the previous example embodiment, the bottom width $D_B'$ of the gate isolation layer 155' is smaller than the top width $d_T$ of the insulating barrier 151'.

As such, the gate cut structure which may be employed in some example embodiments may have various profiles depending on the widths of the gate isolation layer and the insulating barrier.

As described above, gate cut structures 150 and 150' employed in the present example embodiment are formed using various processes (e.g., a self-alignment process or a photo/etching process) before and after the replacement process. The various features of the present inventive concepts will be more easily understood in the course of describing some example manufacturing methods.

FIGS. 7 to 11 are cross-sectional views of processes illustrating a manufacturing method of a semiconductor device according to an example embodiments, and correspond to a cross-section taken along line of FIG. 1.

Figure 7:
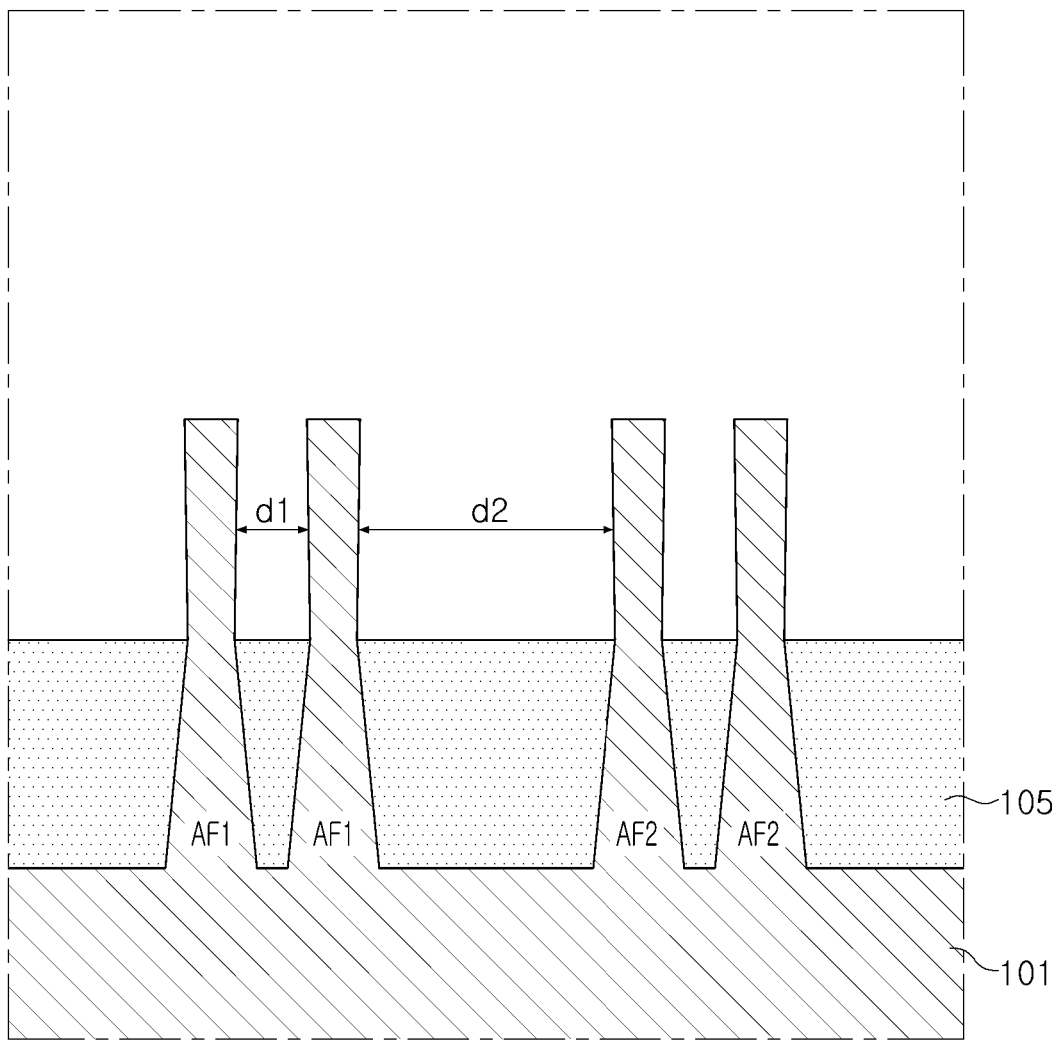
FIGS. 7 to 11 are cross-sectional views of processes illustrating a method of manufacturing a semiconductor device, according to an example embodiment, and correspond to a cross-section taken along line of FIG. 1.

Referring to FIG. 7, first and second active fins AF1 and AF2 extending in the first direction D1 are formed on a substrate 101.

The first and second active fins AF1 and AF2 may be protruded above the device isolation layer 105 to a desired height by using a recessing process. The first and second active fins AF1 and AF2 may be arranged at different intervals. In the present example embodiment, the interval between the first active fins AF1 and the interval between the second active fins AF2 are the first interval d1, and the interval between the first and second active fins AF1 and AF2 is the second interval d2, which is greater than d1. Here, each adjacent pair of the first active fins AF1 and the second active fins AF2 may be connected by an epitaxial regrowth layer to provide a source and a drain in a subsequent process.

Figure 8:
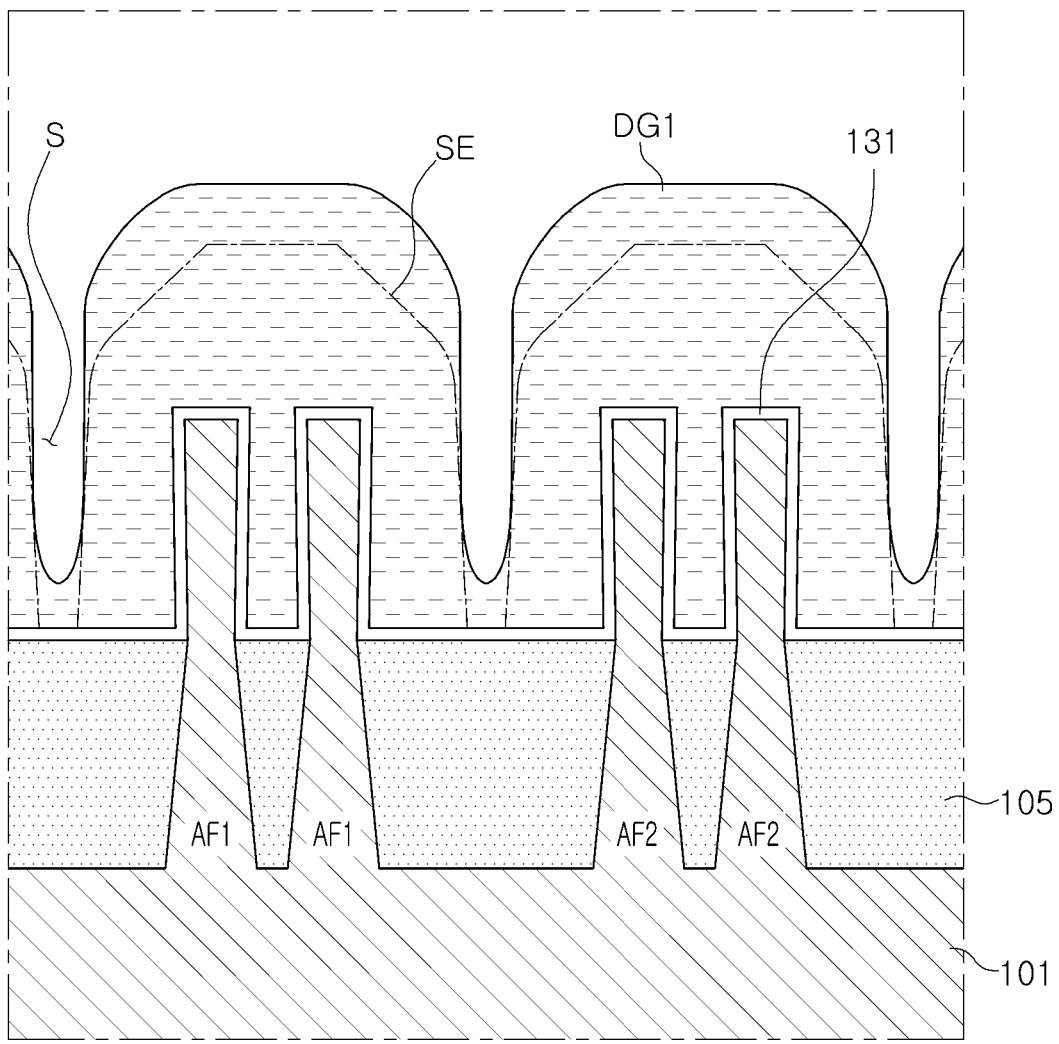

Referring to FIG. 8, a first dummy gate material DG1' is formed on the device isolation layer 105.

A gate insulating film 131 may be formed on the surfaces of the first and second active fins AF1 and AF2, before forming the first dummy gate material DG1. For example, the gate insulating film 131 may be an oxide. The gate insulating layer 131 may be formed conformally in a deposition process. If the gate insulating layer 131 is formed using an oxidation process, the gate insulating layer 131 may only be formed on the surfaces of the first and second active fins AF1 and AF2. The gate insulating film 131 may be used as a gate dielectric film in a peripheral circuit as is, may be used together with another dielectric film in a circuit (e.g., a SRAM cell circuit) or may be replaced with another dielectric film.

In the example embodiment, a dummy gate is formed by performing a two-step process, the process illustrated in FIG. 8 corresponds to a first deposition step of forming the first dummy gate material DG1'. The first step may be performed until the plurality of active fins AF1 and AF2 are covered. For example, the first dummy gate material DG1' may be polysilicon.

In the first step, the space between the active fins may be filled or remained depending on the interval of the active fins. For example, the space between the first and second active fins AF1 and AF2 that are arranged in the first interval d1 may be almost completely filled, and the space between the first and second active fins AF1 and AF2 that are arranged in the second interval d2 may be partially filled such that an empty space S is maintained. The space S between the first and second active fins AF1 and AF2 may be controlled through the interval between the first and second active fins AF1 and AF2 and the thickness of the first dummy gate material DG1'.

Figure 9:
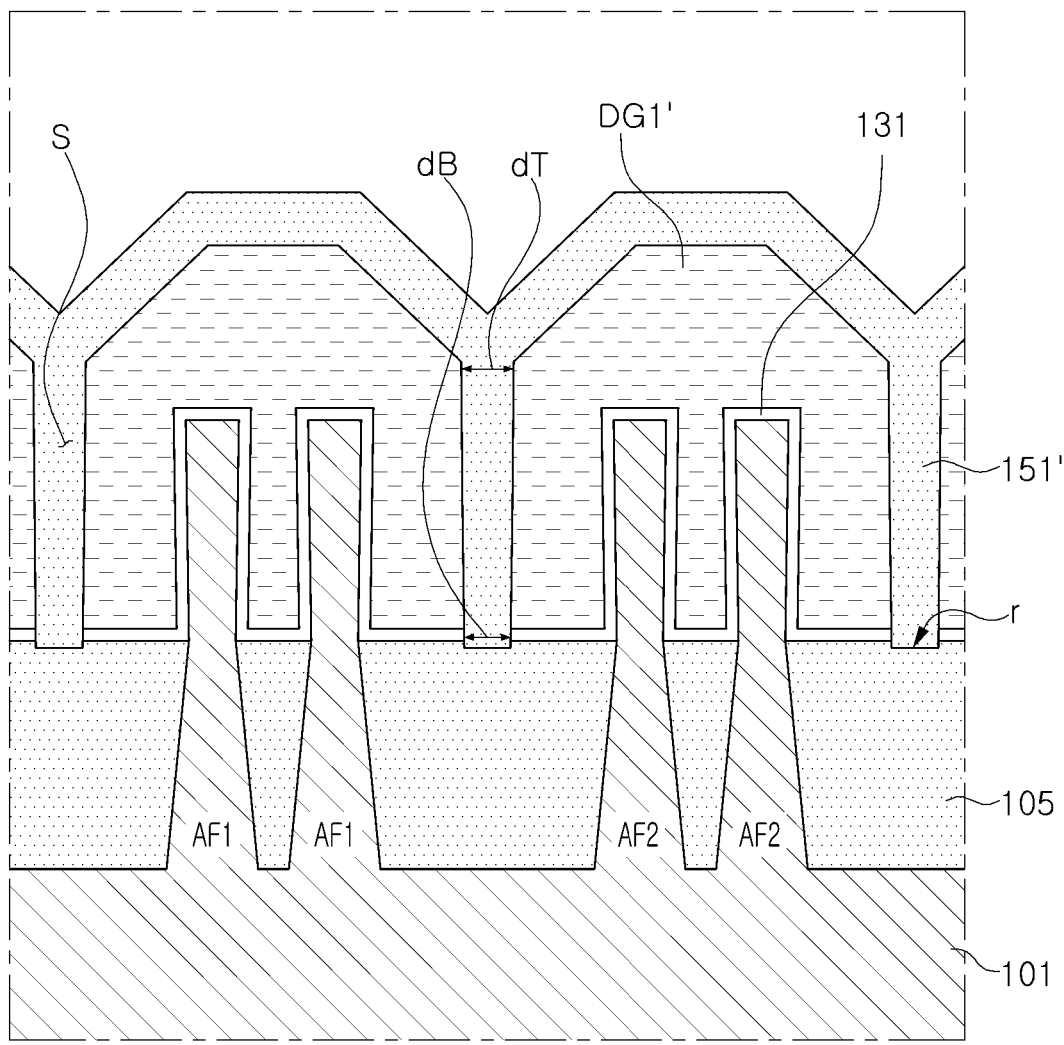

Referring to FIG. 9, the first dummy gate material DG1' may be partially removed from the space S between the first and second active fins AF1 and AF2 to expose the device isolation layer 105 to form a modified first dummy gate material DG1", and an insulating barrier layer 151' may be formed on the modified first dummy gate material layer DG1".

The first dummy gate material DG1' may be etched to a desired thickness by applying spacer etching (e.g., an isotropic etching), to form the modified first dummy gate material DG1". The etching may be performed until a part of the device isolation layer 105 is exposed in the space S between the first and second active fins AF1 and AF2 that are arranged in the second interval d2. In this process, an exposed area of the device isolation layer 105 may have a recessed portion r. Then, the exposed portion of the device isolation layer 105 may be provided between the modified first dummy gate material DG1" or a bottom surface of the space surrounded by the modified first dummy gate material layer DG1".

Then, the insulating barrier layer 151' may fill the space S between the modified first dummy gate material DG1" or the space S surrounded by the modified first dummy gate material DG1". According to the present example embodiment, the insulating barrier layer 151' is not provided to contact the exposed area of the device isolation layer 105 between each of the first and second active fins AF1 and AF2. For example, the insulating barrier layer 151' may not be provided to contact the exposed area of the device isolation layer 105 at a location where a space between a corresponding pair of the first and second active fins AF1 and AF2 is almost fully filled, whereas the insulating barrier layer 151' may fill in the space S between the first and second active fins AF1 and AF2 such that the insulating barrier layer 151' contacts the exposed area of the device isolation layer 105. The insulating material may be, for example, nitride (e.g., silicon nitride).

Figure 10:
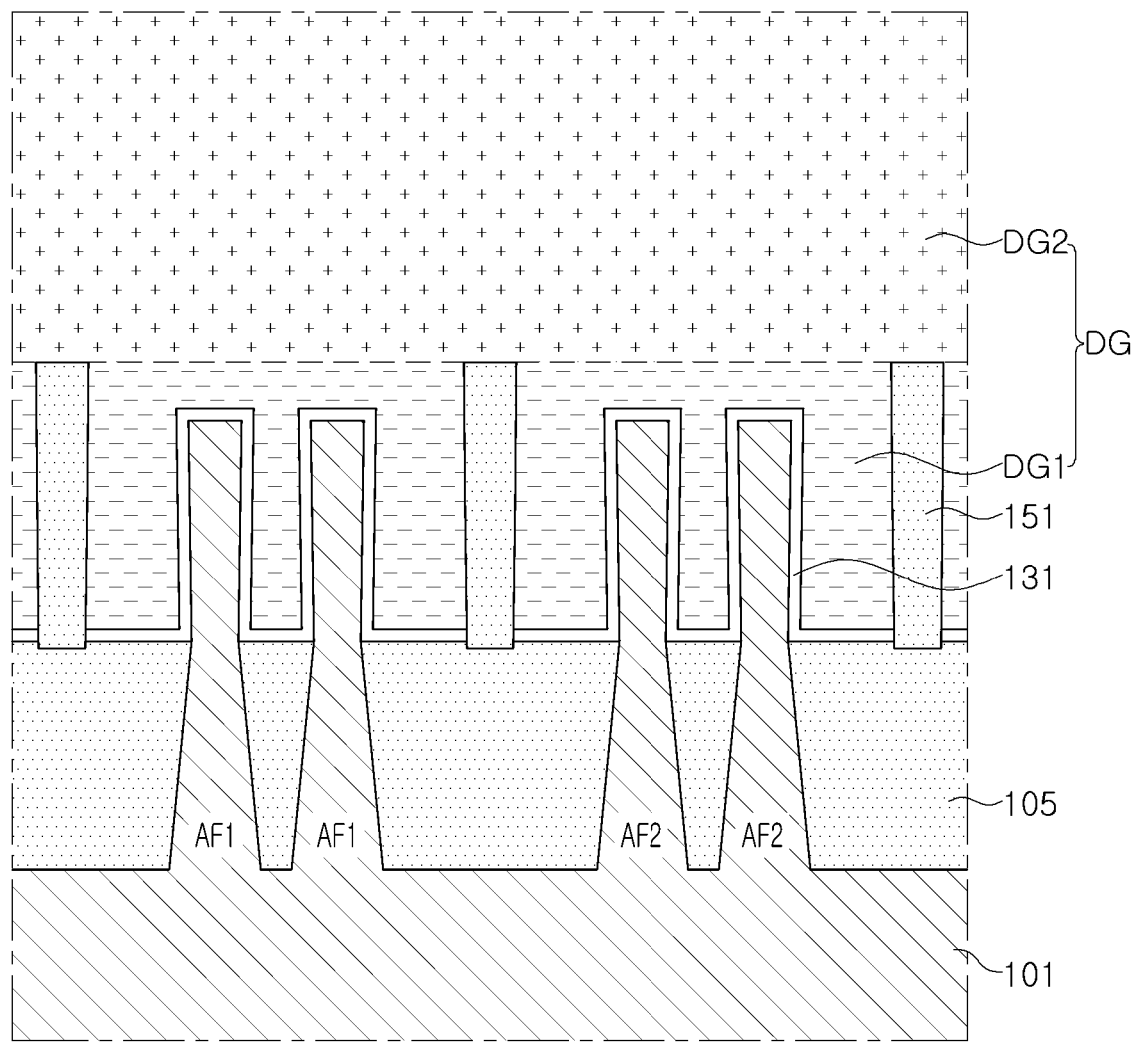

Referring to FIG. 10, the resultant structure of FIG. 9 is polished to exposed the modified first dummy gate material DG1" in an area corresponding to the first and second active fins AF1 and AF2 to provide a first dummy gate material layer DG1, and then the second dummy gate material layer DG2 is formed on the first dummy gate material layer DG1.

An upper surface of the resultant structure of FIG. 9 may be planarized by polishing the modified first dummy gate material DG1" and the insulating barrier 151. In this process, a top surface of the modified first dummy gate material DG1" may be exposed in an area corresponding to the first and second active fins AF1 and AF2. To prevent the first and second active fins AF1 and AF2 from being damaged during the polishing process, the insulating barrier 151 between the first and second active fins AF1 and AF2 may be formed higher than the active fins AF1 and AF2. The planarization process may be performed by a chemical mechanical polishing CMP process or a dry etchback process.

The height of a final dummy gate structure DG may be adjusted by forming the second dummy gate material layer DG2 through a second deposition process on the polished first dummy gate material layer (e.g., the first dummy gate material layer pattern) DG1. As such, the final dummy gate structure DG may be formed by a two-step process that includes a first deposition step of forming the first dummy gate material layer DG1' and a second deposition step of forming the second dummy gate material layer DG2. Prior to performing the second deposition process, the planarized surface of the first dummy gate material layer DG1 may be cleaned. For example, the second dummy gate material layer DG2 may include the same material (e.g., polysilicon) as the first dummy gate material layer DG1.

Figure 11:
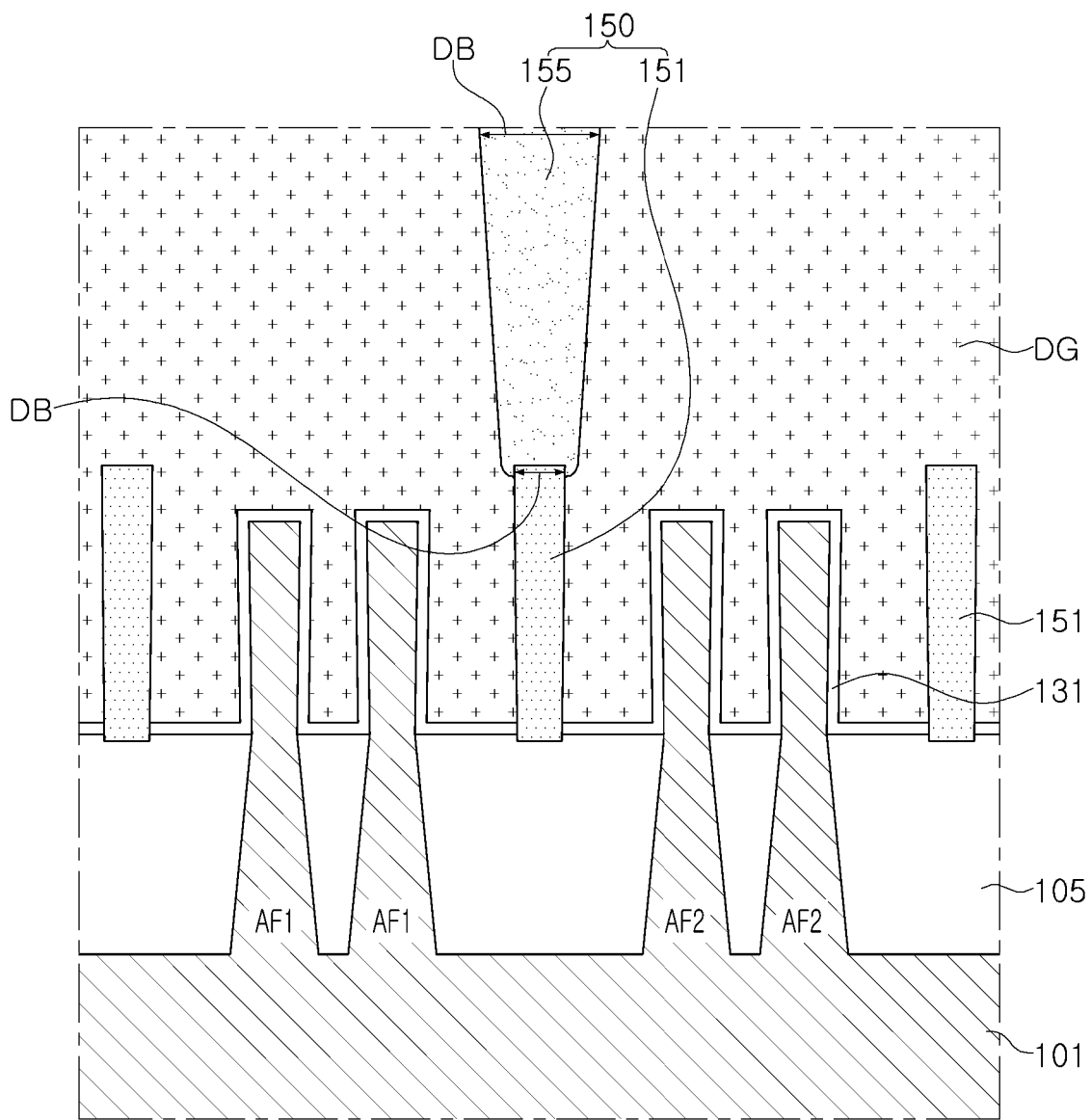

Referring to FIG. 11, the gate isolation layer 155 is formed in a desired isolation area of the dummy gate structure DG.

Figure 12:
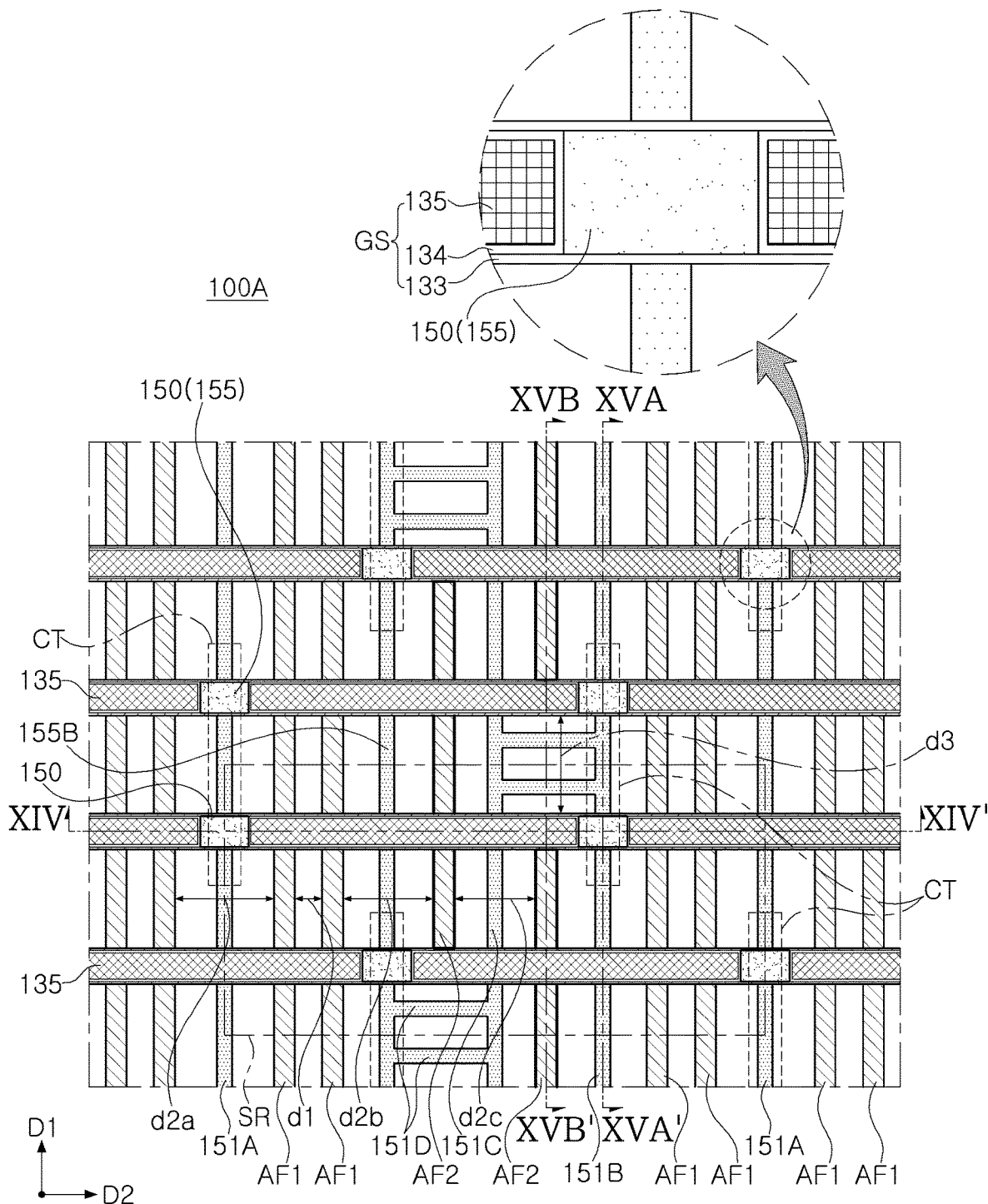
FIGS. 12 and 13 are plan views illustrating a semiconductor device, according to an example embodiment.

The process for forming the gate isolation layer 155 may be performed after patterning the dummy gate structure DG to have patterns corresponding to the final gate structure (GS of FIG. 1) (hereinafter, referred as "dummy gate pattern"). As illustrated in FIG. 12, an isolation hole may be formed in one area of the dummy gate structure DG such that the dummy gate structure DG is separated into two dummy gate structures, and the isolation hole may be filled with the isolation material to form the gate isolation layer 155. Here, a portion of the insulating barrier 151 is exposed through the isolation hole such that the gate isolation layer 155 is connected to the portion of the insulating barrier 151. The insulating barrier 151 and the gate isolation layer 155 may form the gate cut structure 150. For example, the insulating material for the gate isolation layer 155 may be nitride (e.g., silicon nitride). The gate isolation layer 155 may include the same insulating material as the insulating barrier 151.

Figure 13:
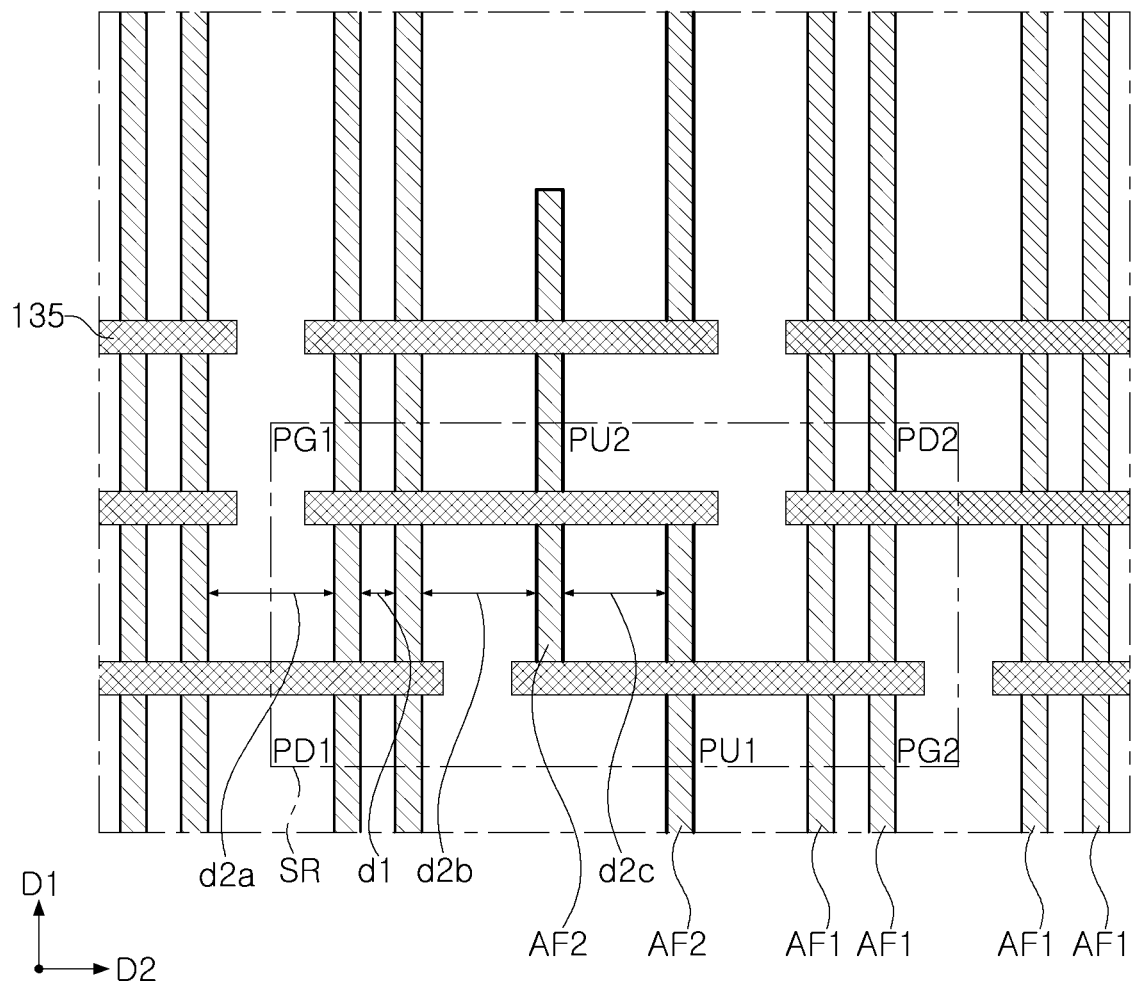
Figure 14:
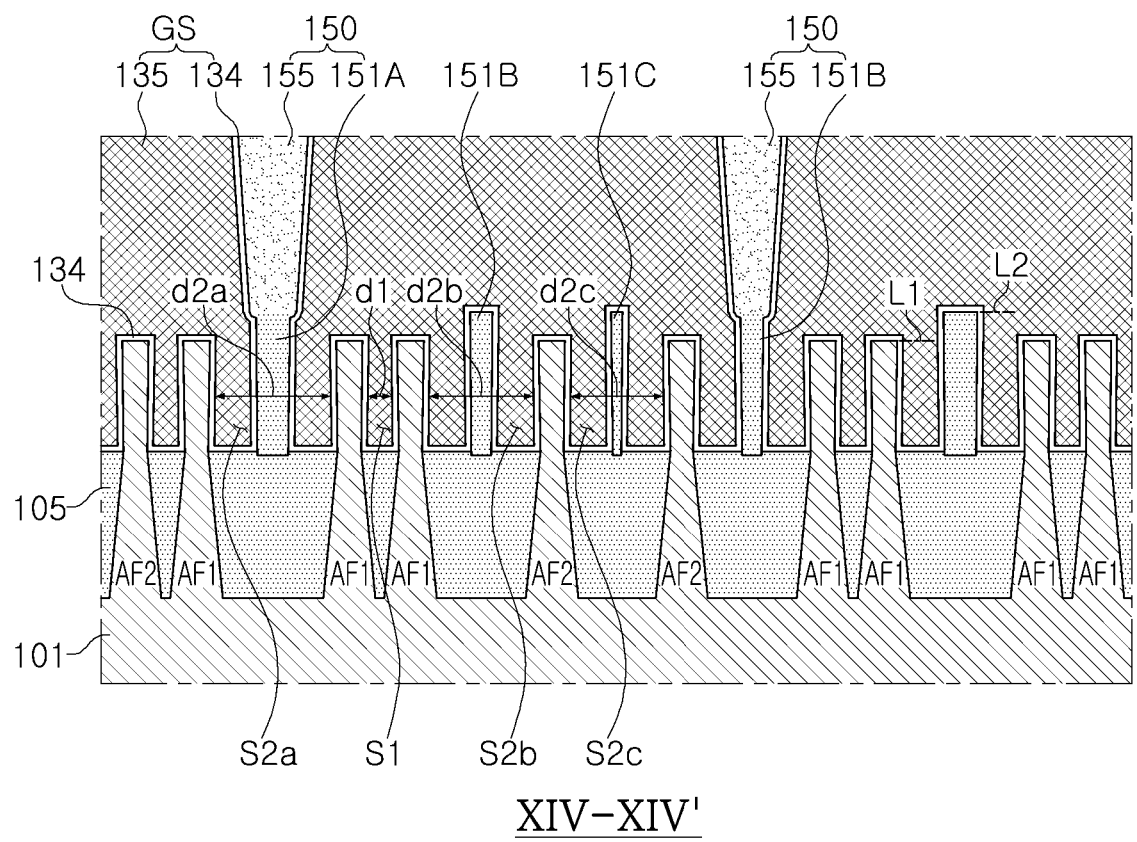
FIG. 14 is a cross-sectional view taken along line XIV-XIV' of the semiconductor device illustrated in FIG. 12.

FIGS. 12 and 13 are plan views illustrating a semiconductor device, according to an example embodiment, and FIG. 14 is a cross-sectional view taken along line XIV-XIV' of the semiconductor device illustrated in FIG. 12.

Referring to FIGS. 12 and 14, a semiconductor device 100A according to the present example embodiment may include first and second active fins AF1 and AF2 and the device isolation layer 105, which are disposed in the substrate 101, and the gate structure GS. The description of the same components as the above-described example embodiments may not be repeated.

The device isolation layer 105 defines in the substrate 101 and between the first and second active fins AF1 and AF2. Further, the first and second active fins AF1 and AF2 include portions protruding above the device isolation layer 105. The first and second active fins AF1 and AF2 may be a conductive semiconductor structure doped with an impurity. In the present example embodiment, although not limited thereto, a first active fin AF1 may be an n-type semiconductor for a PMOS transistor, and a second active fin AF2 may be a p-type semiconductor for an NMOS transistor.

As illustrated in FIG. 12, the first active fin AF1 and the second active fin AF2 may be extended in the first direction D1. Each of the first active fins AF1 and the second active fins AF2 provide an active area of each transistor. Further, a plurality of gate structures GS may be extended in a second direction D2 intersecting the first direction D1. The plurality of gate structures GS may overlap respective areas of the first and second active fins AF1 and AF2, and each of the overlapped areas may provide one transistor. The semiconductor device, according to an example embodiment, constitutes an SRAM circuit.

FIG. 13 is a plan view illustrating only the first and second active fins AF1 and AF2 and the gate structure GS for easy understanding of a circuit configuration of the semiconductor device of FIG. 12.

Referring to FIGS. 12 and 13, an SRAM cell labeled as "SR" includes a first inverter including a first pull-up transistor PU1 and a first pull-down transistor PD1, connected in series, and a second inverter including a second pull-up transistor PU2 and a second pull-down transistor PD2, connected in series, and first and second pass transistors PS1 and PS2 (not shown) connected to output nodes of the first and second inverters, respectively. Here, the first and second pull-up transistors PU1 and PU2 may be PMOS transistors, and the first and second pull-down transistors PD1 and PD2 may be NMOS transistors.

To implement a SRAM cell circuit as illustrated in FIGS. 12 and 13, the first and second active fins AF1 and AF2 may be arranged at different intervals.

Referring to FIGS. 12 to 14, the first and second active fins AF1 and AF2 are arranged at a plurality of different intervals d1, d2a, d2b, and d2c. The plurality of intervals may be set to be d2a>d2b>d2c>d1.

For example, two pairs of the first active fins AF1 in the SRAM cell SR may be arranged at a first interval d1 (the shortest interval), and a certain pair of the first active fins AF1 may be arranged at a second interval d2a, (the largest interval) from an adjacent pair of first active fins AF1. The first and second active fins AF1 and AF2 may be arranged at a third interval d2b, and adjacent second active fins AF2 may be arranged at a fourth interval d2c.

An insulating barrier may not be formed when an interval of adjacent active fins is narrow. In the present example embodiment, the insulating barrier may not exist in the space 51 between the first active fin AF1 that are arranged at the first interval d1.

In the case that the insulating barrier is provided in the space between a pair of adjacent active fins, the width of the insulating barrier may vary depending on the interval between the pair of the adjacent active fins. In particular, the width of the insulating barrier in the space may be proportional to the interval between the pair of the adjacent active fins.

In the present example embodiment, a first insulating barrier 151A having a first width w1 is formed in a space S2a between the first active fins AF1 arranged at a second interval d2a, and a second insulating barrier 151B having a second width w2 smaller than the first width w1 is formed in a space S2b between the first and second active fins AF1 and AF2 arranged at a third interval d2b. Further, a third insulating barrier 151C having a third width w3 smaller than the second width is formed in a space S2c between the second active fins AF2 arranged in the third interval d2c.

As described above, the first to third insulating barriers 151A, 151B and 151C having different widths may be formed by using the self-alignment process described above by setting the intervals of the active fins differently.

Figure 15A:
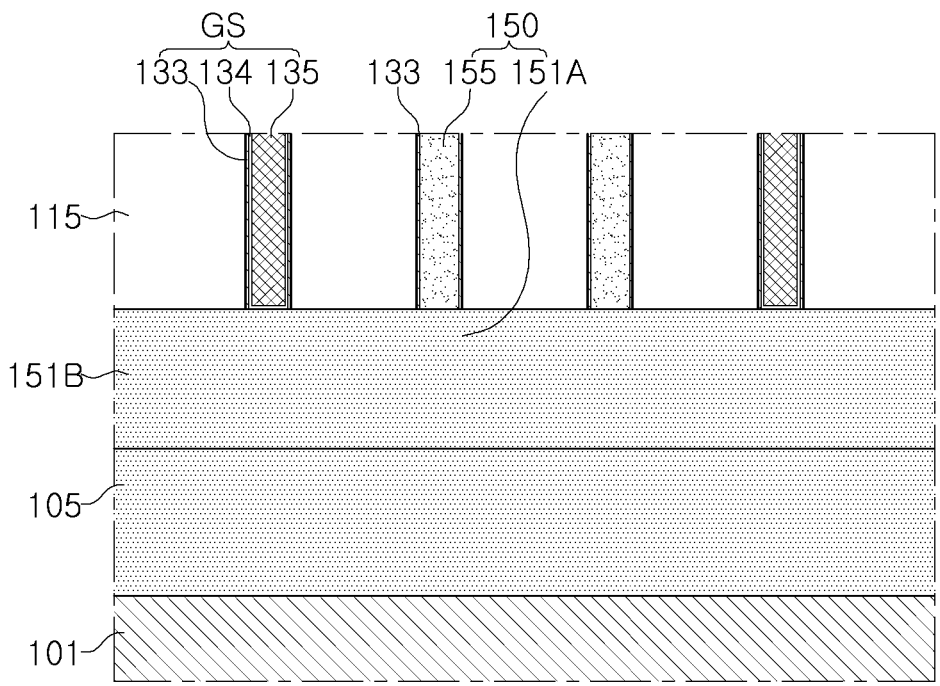
FIGS. 15A and 15B are cross-sectional views taken along line XVA-XVA' and line XVB-XVB', respectively, of the semiconductor device illustrated in FIG. 11.
Figure 15B:
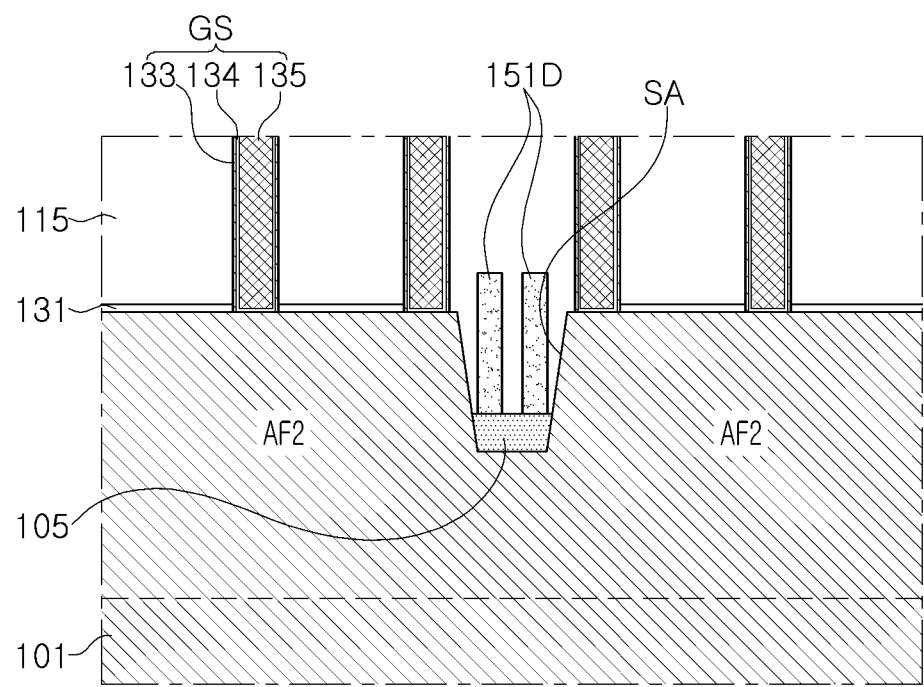

Referring to FIGS. 12 and 15B, the semiconductor device 100A according to some example embodiments may further include a fourth insulating barrier 151D formed in the second direction D2 in addition to the first to three insulating barriers 151A, 151B, and 151C extending in the first direction D1.

The second active fin AF2 is separated in the first direction D1 by a relatively wide interval d3. In the present example embodiment, the separated space S2 may have the widest space (d3>d2a). In this case, fourth insulating barriers 151D may be formed to include, for example, two separate insulating barriers.

As described in the above example embodiments, only some (not all) of the insulating barriers 151A, 151B, 151C, and 151D may be used as the gate cut structure 150. For example, only a portion of each of the first and second insulating barriers 151A and 151B may be employed as a part of the gate cut structure 150.

As illustrated in FIGS. 14 and 15A, the gate cut structures 150 employed in the present example embodiment includes first and second insulating barriers 151A and 151B extending in the first direction D1 and a gate isolation layer 155 disposed on a portion of each of upper surfaces of the first and second insulating barriers 151A and 151B. The gate isolation layer 155 may separate the upper areas of the gate structures GS from each other, and the first and second insulating barriers 151A and 151B may separate the lower areas of the gate structures GS from each other.

Insulating barriers such as the third and fourth insulating barriers 151C and 151D, which are not used as a constituent element for the gate cut structure 150, may remain as dummy elements.

In addition, as illustrated in FIG. 14, although the widths of the first to fourth insulating barriers 151A, 151B, 151C, and 151D are different from each other, the height L2 thereof may be the same or substantially similar to each other, and may be greater than the height L1 of the first and second active fins AF1 and AF2. The upper surfaces of the first to fourth insulating barriers 151A, 151B, 151C, and 151D may be obtained through a polishing process.

Similar to the previous example embodiment, each of the gate structures GS includes a gate dielectric film disposed on a portion of the first and second active fins AF1 and AF2 and a gate electrode 135 disposed on the gate dielectric film 134.

As illustrated in FIG. 14, the gate dielectric film 134 may extend to the side surfaces of the first and second insulating barriers 151A and 151B, and the side surface of the gate isolation layer 155, which are in contact with the gate electrode 135 (observed in a cross-section along line XIV-XIV').

Further, as illustrated in FIG. 15A, the gate structure GS may further include a gate spacer 133 disposed on both side surfaces of a structure including the gate dielectric film 134 and the gate electrode 135. Further, the gate spacer 133 may be provided on both side surfaces of the gate isolation layer 155, which is in contact with the gate electrode and both side surfaces of the gate isolation layer that is not in contact with the gate electrode 135 (observed in a cross-section along line XVA-XVA'). The gate spacer 133 may not be formed on the surfaces of the first and second insulating barriers 151A and 151B.

FIGS. 16A, 17A, 18A, and 19A are plan views of processes illustrating a method of manufacturing the semiconductor device illustrated in FIG. 12, according to an example embodiment. FIGS. 16B, 17B, 18B, and 19B correspond to cross-sectional views of FIGS. 16A, 17A, 18A, and 19A, respectively, taken along line XIV-XIV' of FIG. 12.

Figure 16A:
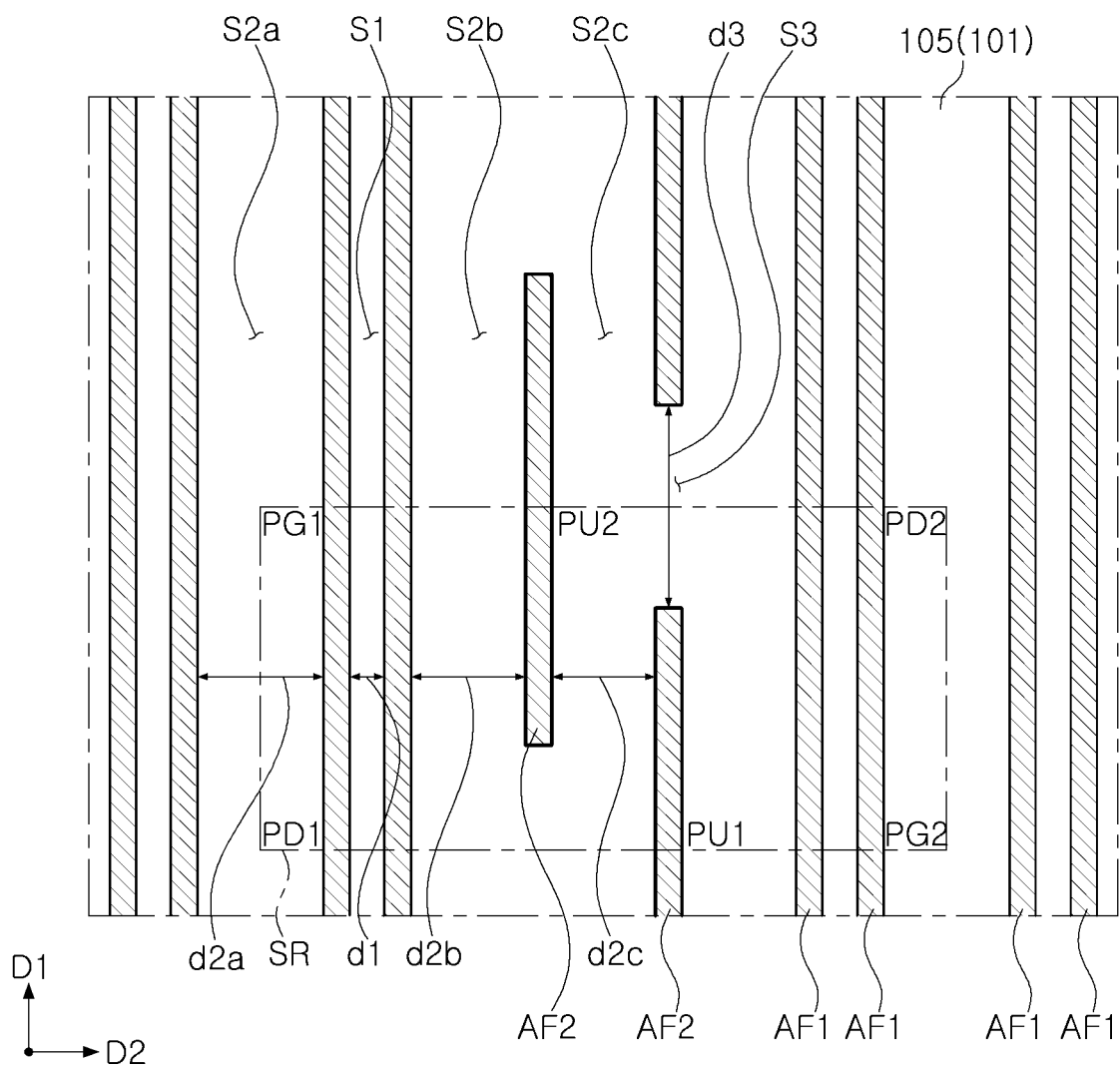
FIGS. 16A, 17A, 18A, and 19A are plan views of processes illustrating a method of manufacturing the semiconductor device (forming an insulating barrier) illustrated in FIG. 12, according to an example embodiment.
Figure 16B:
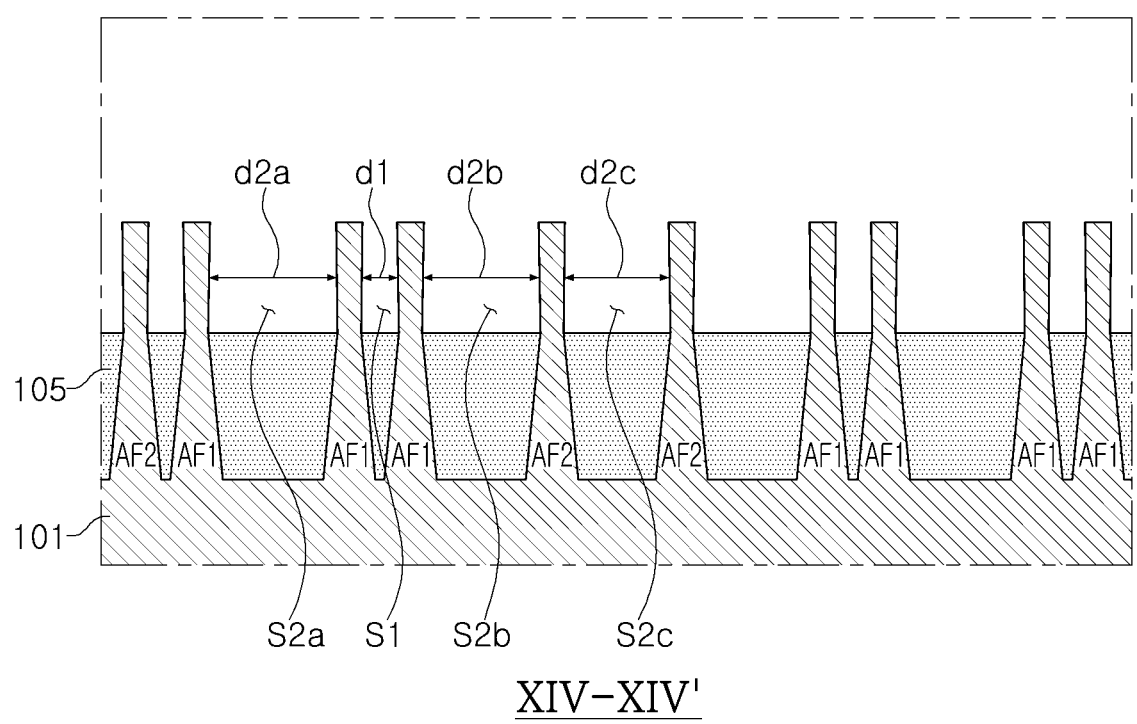
FIGS. 16B, 17B, 18B, and 19B correspond to cross-sectional views of FIGS. 16A, 17A, 18A, and 19A, respectively, taken along line XIV-XIV' of FIG. 12.

Referring to FIGS. 16A and 16B, the first and second active fins AF1 and AF2 that are extended in the first direction D1 on the substrate 101 and arranged at different intervals are formed.

The first and second active fins AF1 and AF2 may protrude above the device isolation layer 105 to a desired height using a recessing process. The first and second active fins AF1 and AF2 may be arranged at different intervals (d2a>d2b>d2c>d1). For example, two pairs of the first active fins AF1 in the SRAM cell SR may be arranged at the first interval d1 (the shortest interval), and a certain pair of the first active fins AF1 may be arranged at the second interval d2a (the largest interval) from the adjacent pair of first active fins AF1. The first and second active fins AF1 and AF2 may be arranged at a third interval d2b, and the adjacent second active fin AF2 may be arranged at a fourth interval d2c. Further, the second active fin AF2 is separated in the first direction D1 by a space S3, and the space S3 may have a relatively wide interval d3 (d3>d2a).

Figure 17A:
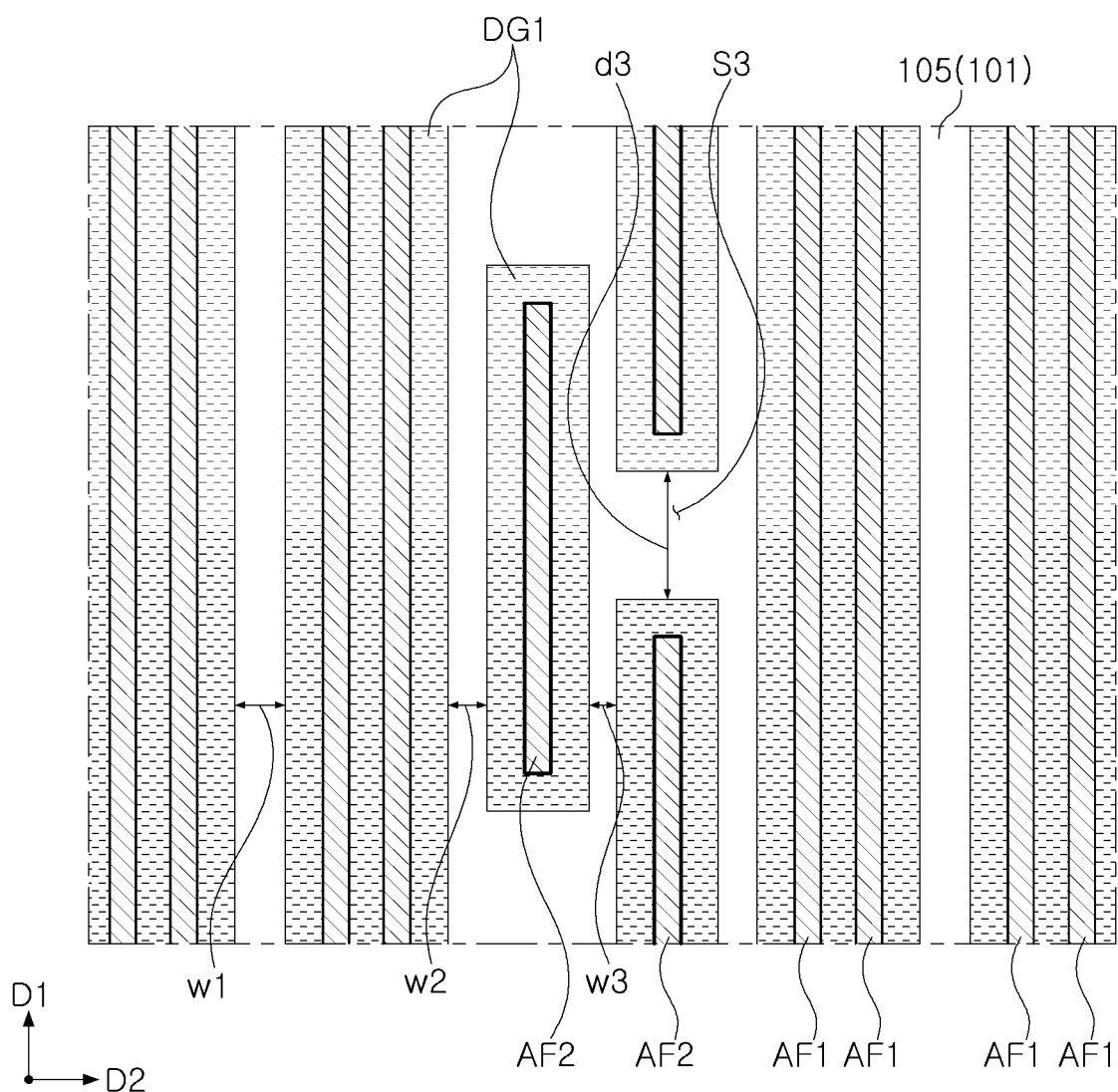
Figure 17B:
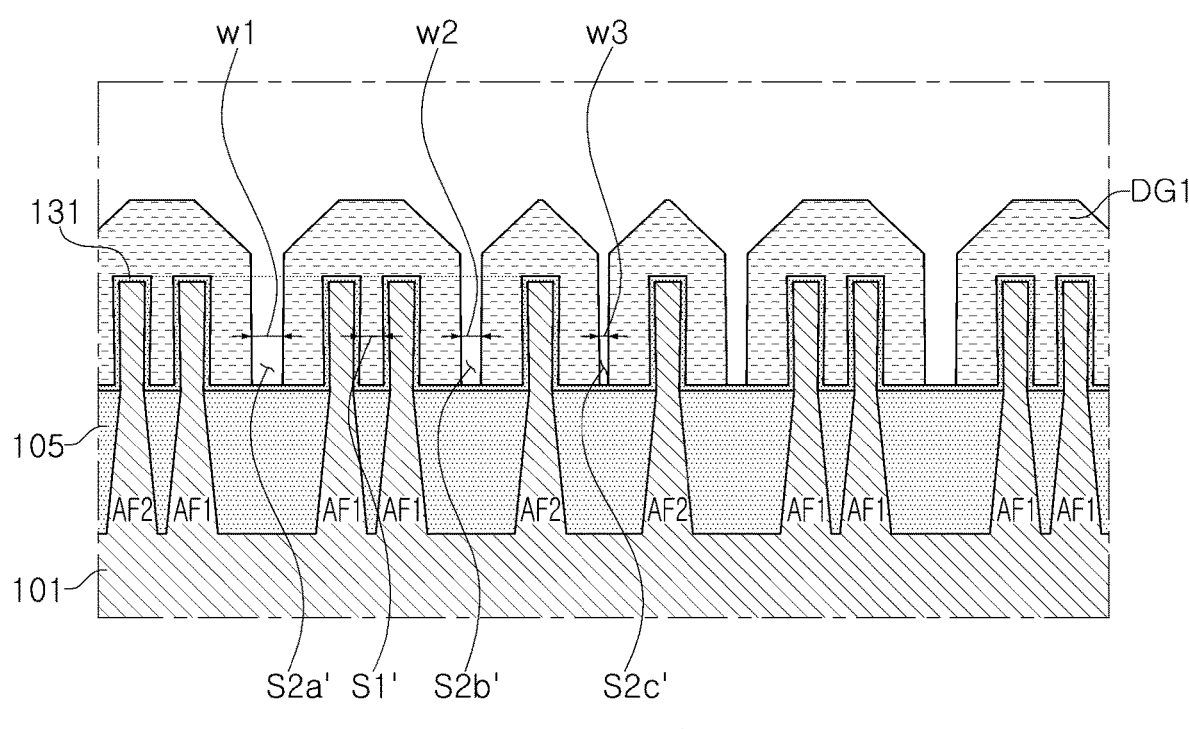

Referring to FIGS. 17A and 17B, a first dummy gate material (not shown) may be deposited and etched using a spacer etching to form a first dummy gate material layer DG1 such that the device isolation layer 105 between the first and second active fins AF1 and AF2 is exposed by the first dummy gate material layer DG1.

Before forming the first dummy gate material, a gate insulating film 131 may be formed on the surfaces of the first and second active fins AF1 and AF2. Deposition of the first dummy gate material may be performed until the plurality of active fins AF1 and AF2 are completely covered. For example, the first dummy gate material may be polysilicon. The space 51' between the first active fins AF1 arranged in the first interval d1 (see FIG. 14) may be substantially entirely filled by the first dummy gate material layer.

The present spacer etching may be performed by applying an isotropic etching to etch the first dummy gate material to a certain thickness. In this process, a portion of the device isolation layer 105 may be exposed in spaces S2a, S2b, and S2c between some active fins, and the exposed area of the device isolation layer 105 may be recessed to a certain extent.

Widths of the final spaces between the active fins obtained after the etching may differ from each other depending on the interval of the active fins. For example, a space S2a between the first active fins AF1 may have a first width w1, and a space S2b between the first and second active fins AF1 and AF2 may have a second width w2 smaller than the first width w1. Further, a space S2c between the second active fins AF2 may have a third width w3 smaller than the second width w2. However, the space 51' between first active fins AF1 arranged at the interval d1 may be filled with the first dummy gate material layer DG1.

Figure 18A:
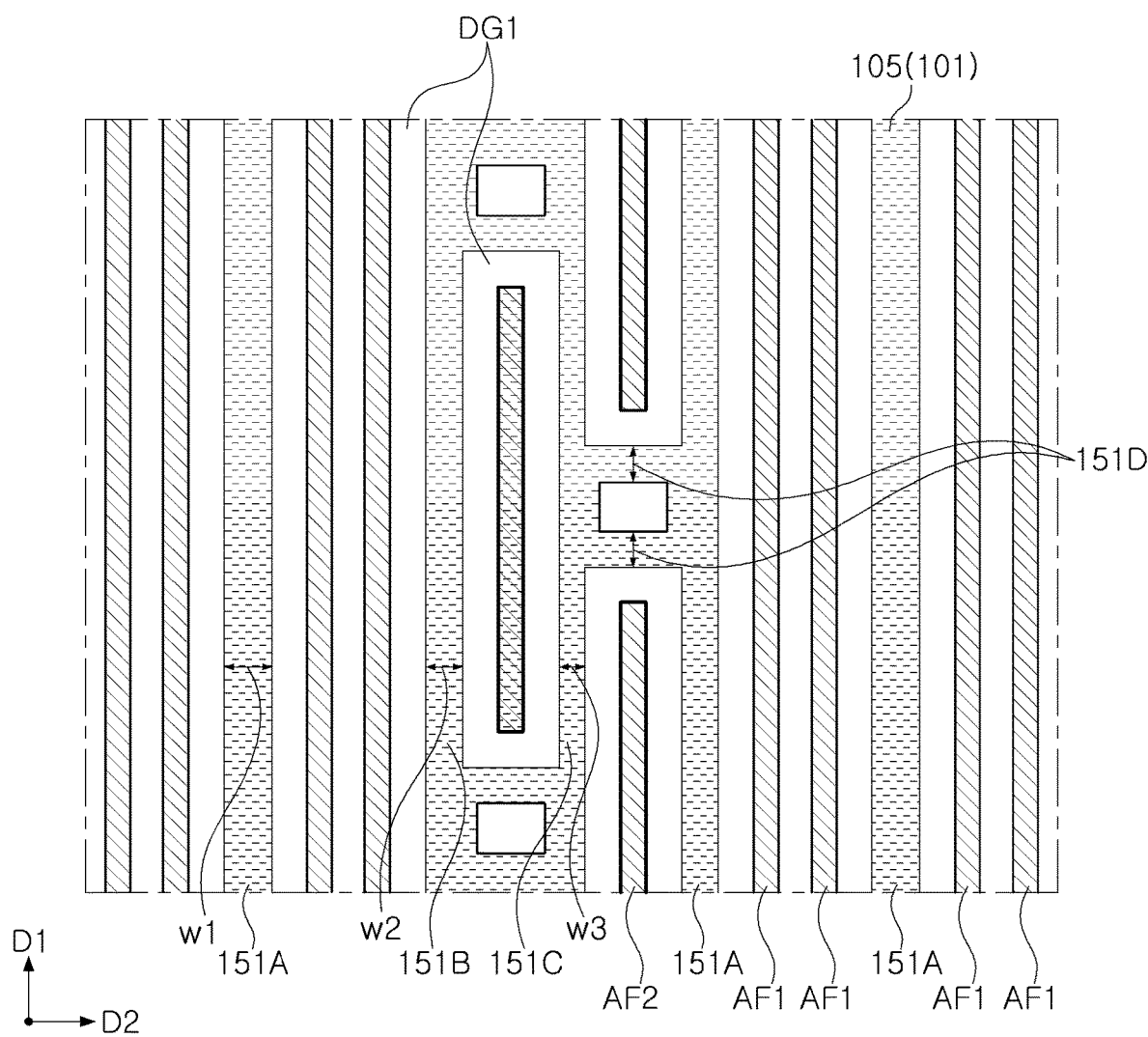
Figure 18B:
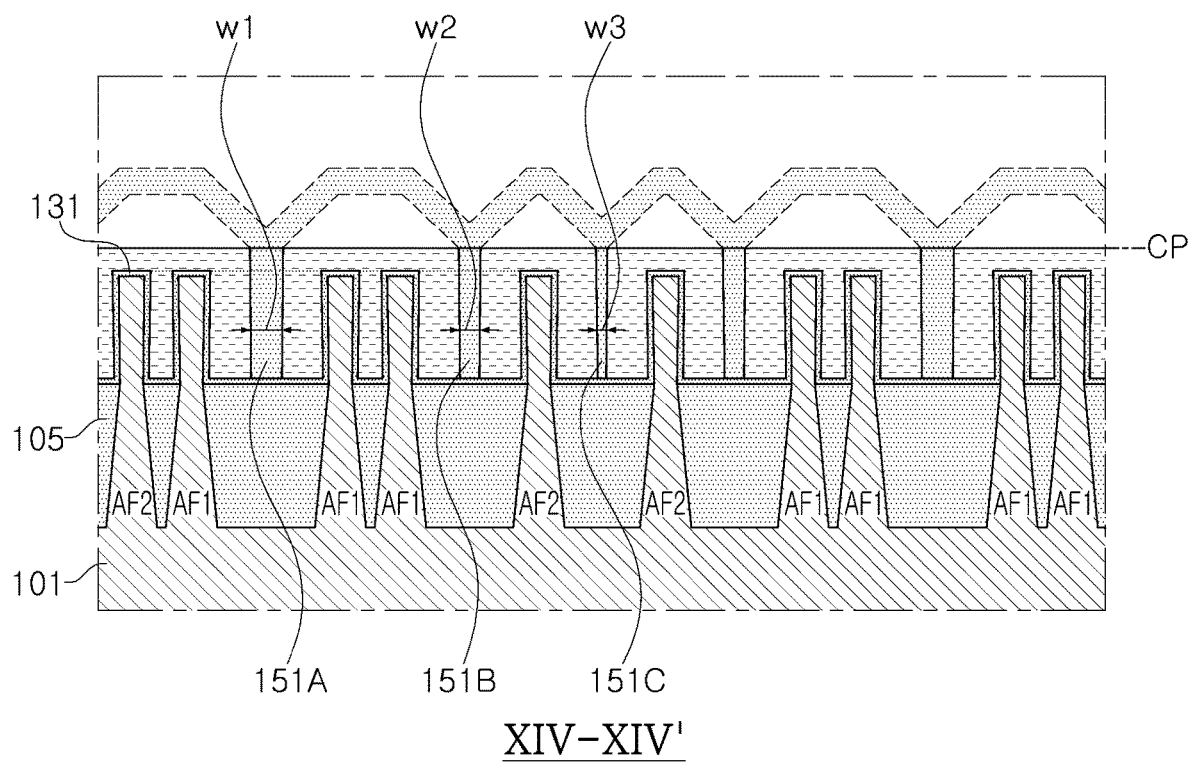

Referring to FIGS. 18A and 18B, an insulating barrier material is deposited on the first dummy gate material layer DG1, and the resultant structure is polished.

Deposition of the insulating barrier material may be performed such that respective spaces S2a, S2b, and S2c surrounded by the first dummy gate material layer DG1 are filled by an insulating barrier material. Then, the first dummy gate material layer DG1 and the insulating barrier 151 may be polished down to the line CP to planarize the upper surface of the resultant structure. Thus, the insulating barrier 151 may be formed to be in contact with an exposed area of the device isolation layer 105.

The first dummy gate material layer DG1 may be exposed in an area corresponding to the first and second active fins AF1 and AF2 by a polishing process (or a planarization process). Thus, the first to third insulating barriers 151A, 151B, and 151C may be provided in the respective spaces S2a, S2b, and S2c. The first to third insulating barriers 151A, 151B, and 151C may have different widths w1, w2, and w3, and may have the same height. As such, the width of the insulating barrier may be determined by the interval of adjacent active fins.

Figure 19A:
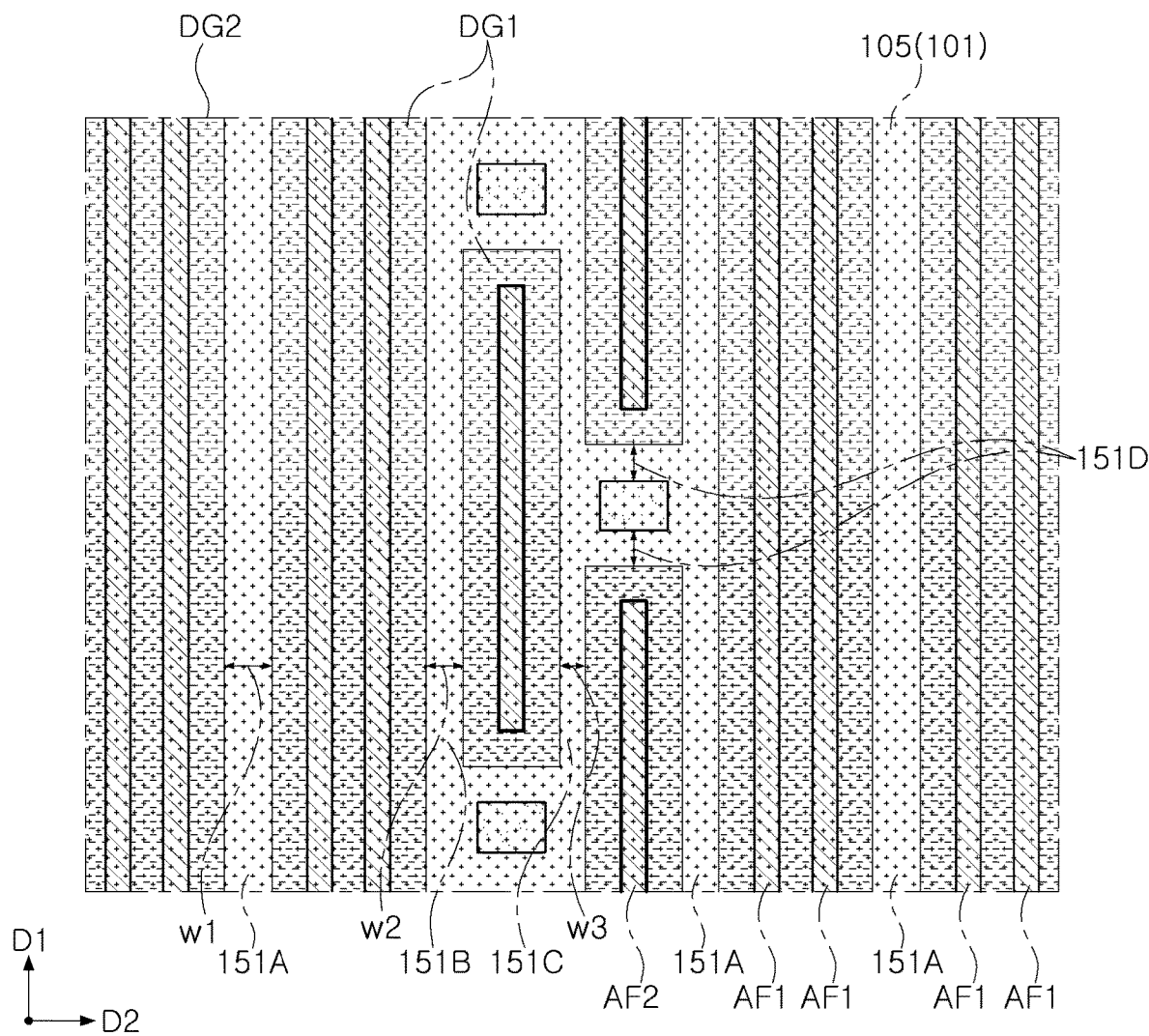
Figure 19B:
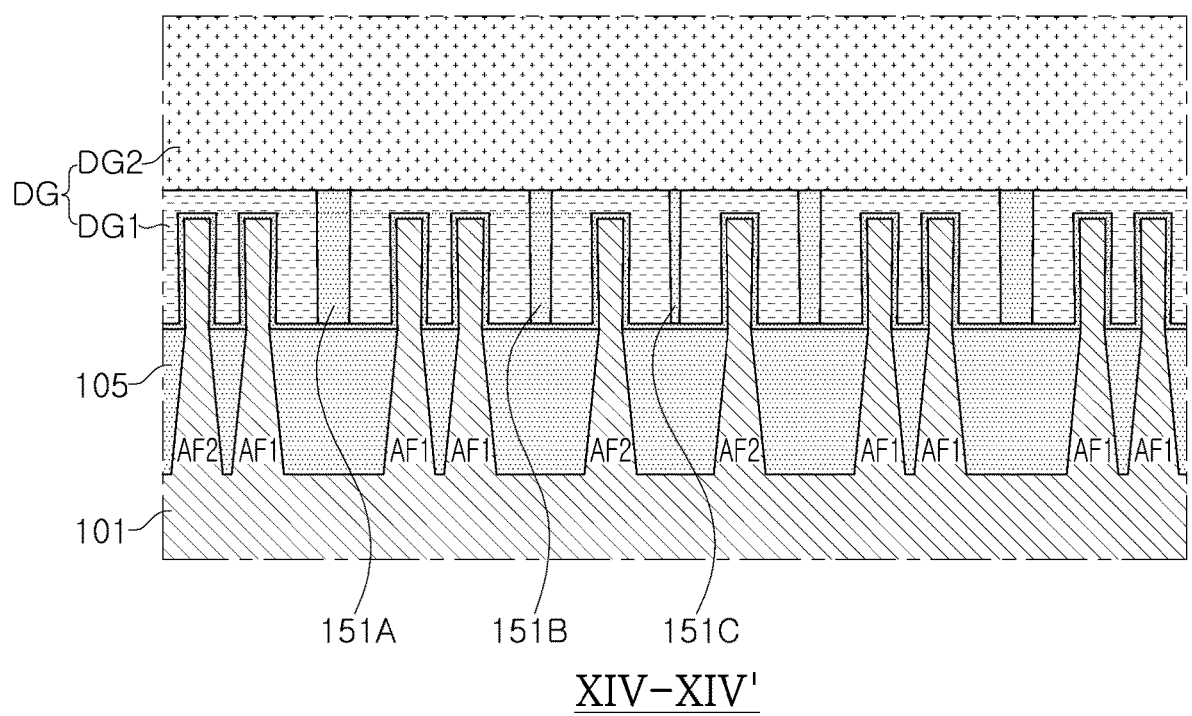

Referring to FIGS. 19A and 19B, the second dummy gate material layer DG2 is formed on the first dummy gate material layer DG1.

The height of the final dummy gate structure DG may be adjusted, by forming the second dummy gate material layer DG2 through the second deposition process on the first dummy gate material layer DG1. As such, the final dummy gate structure DG may be formed by a deposition process more than two times which forms the first dummy gate material layer DG1 and the second dummy gate material layer DG2, respectively. Before the secondary deposition process, the planarized surface of the first dummy gate material layer DG1 may be cleaned. In some example embodiments, the second dummy gate material layer DG2 may be the same material as the first dummy gate material layer DG1. For example, the second dummy gate material layer DG2 may be polysilicon.

Figure 20:
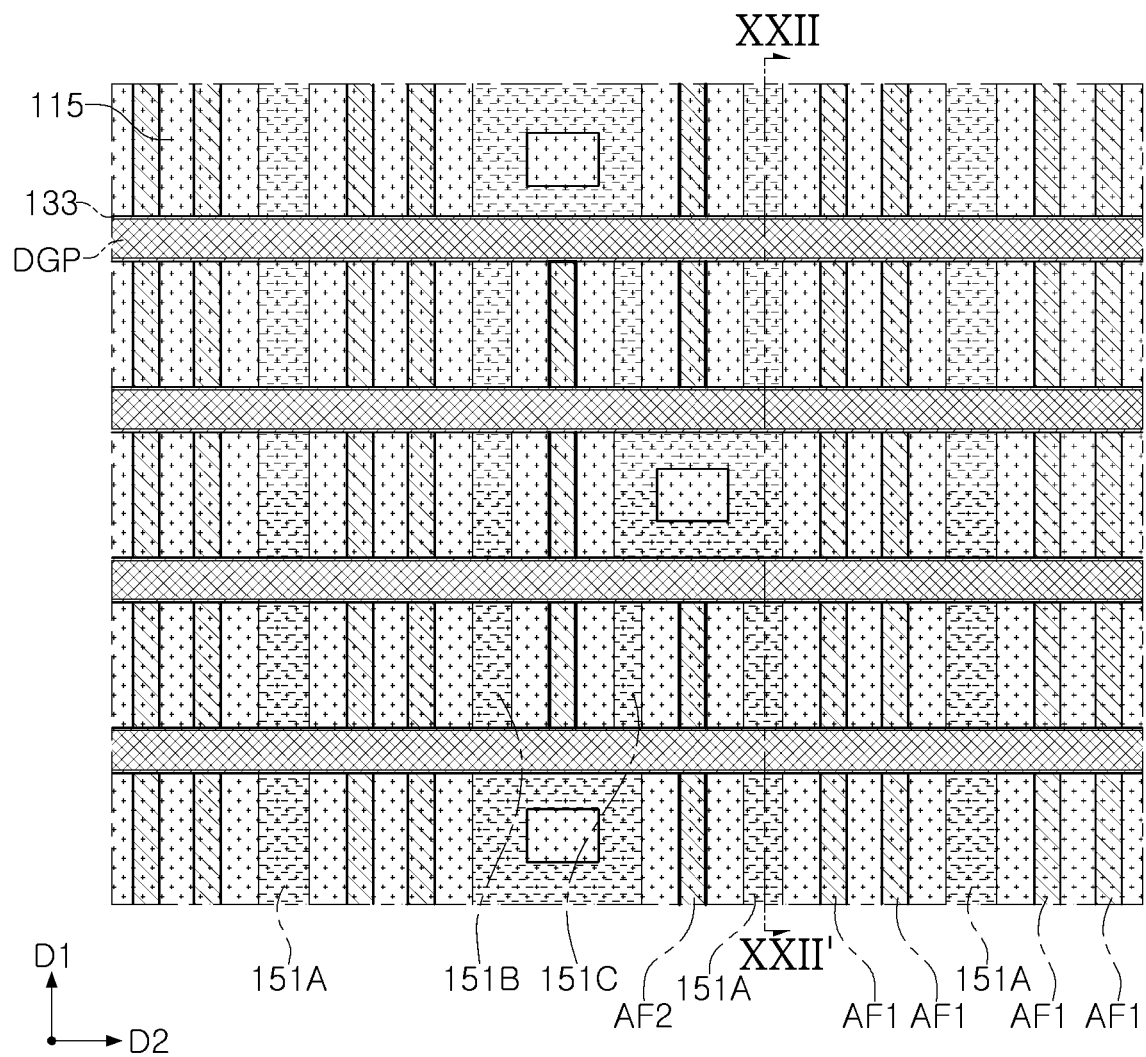
FIGS. 20 and 21 are plan views of processes illustrating a method of manufacturing (replacement process) a semiconductor device, according to an example embodiment.
Figure 21:
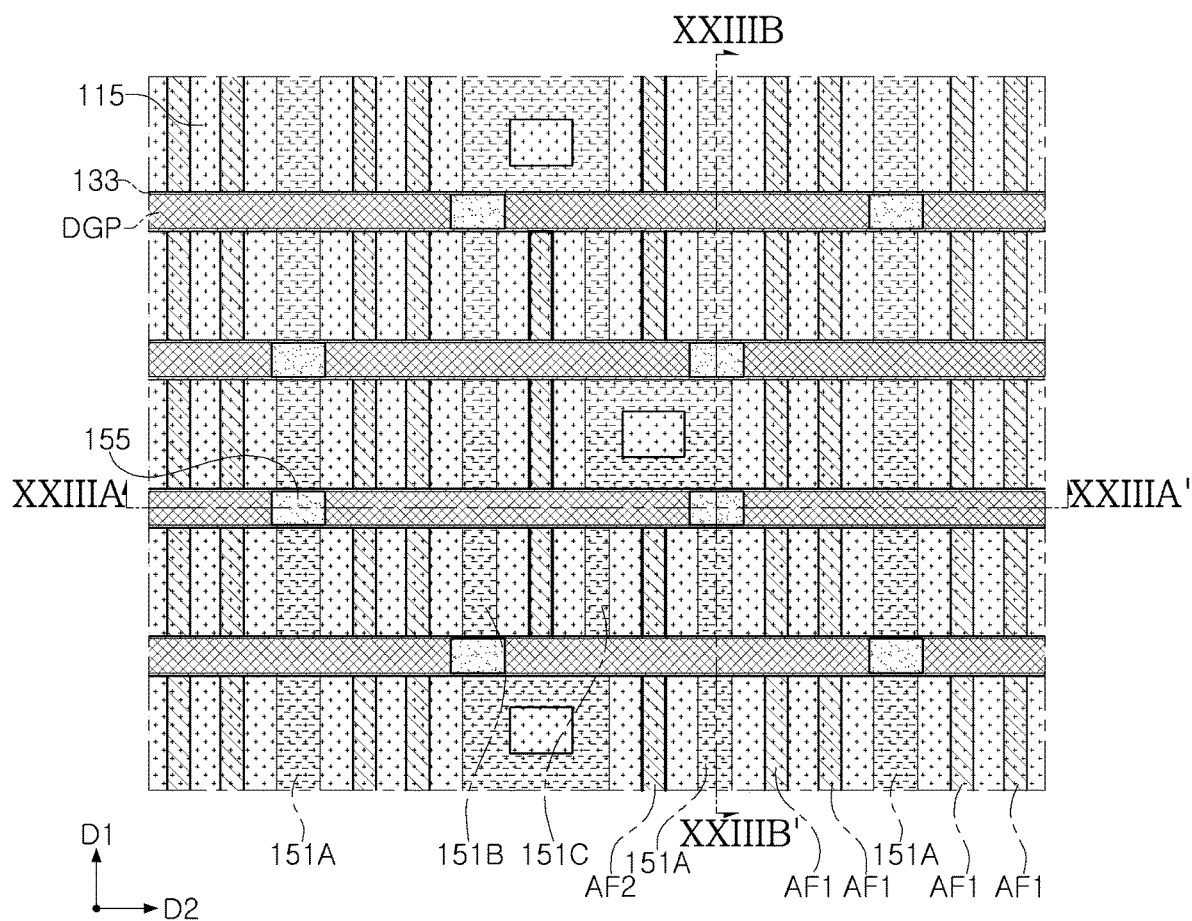
Figure 22:
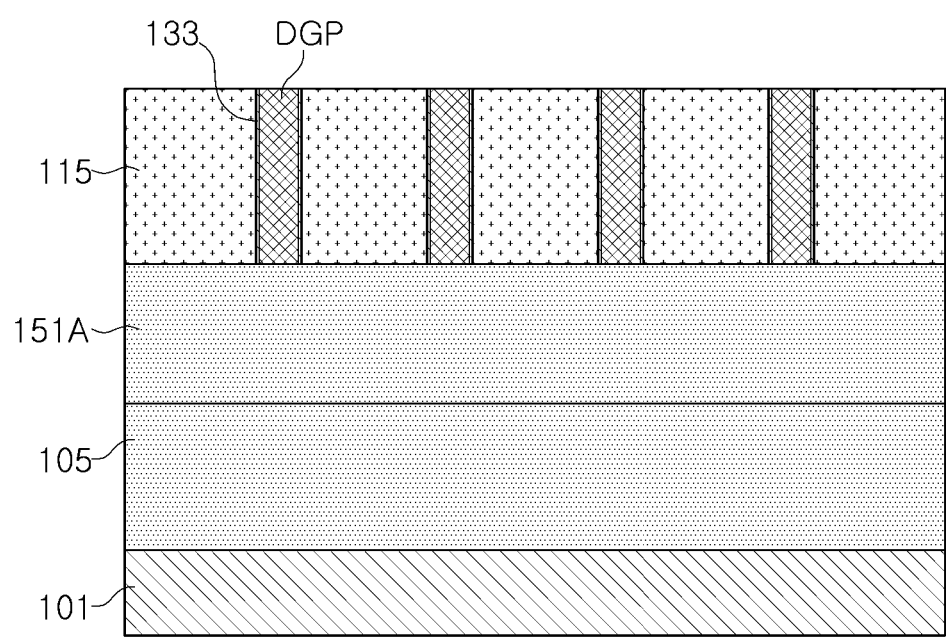
FIG. 22 is a cross-sectional view taken along line XXII-XXII' of FIG. 20.
Figure 23A:
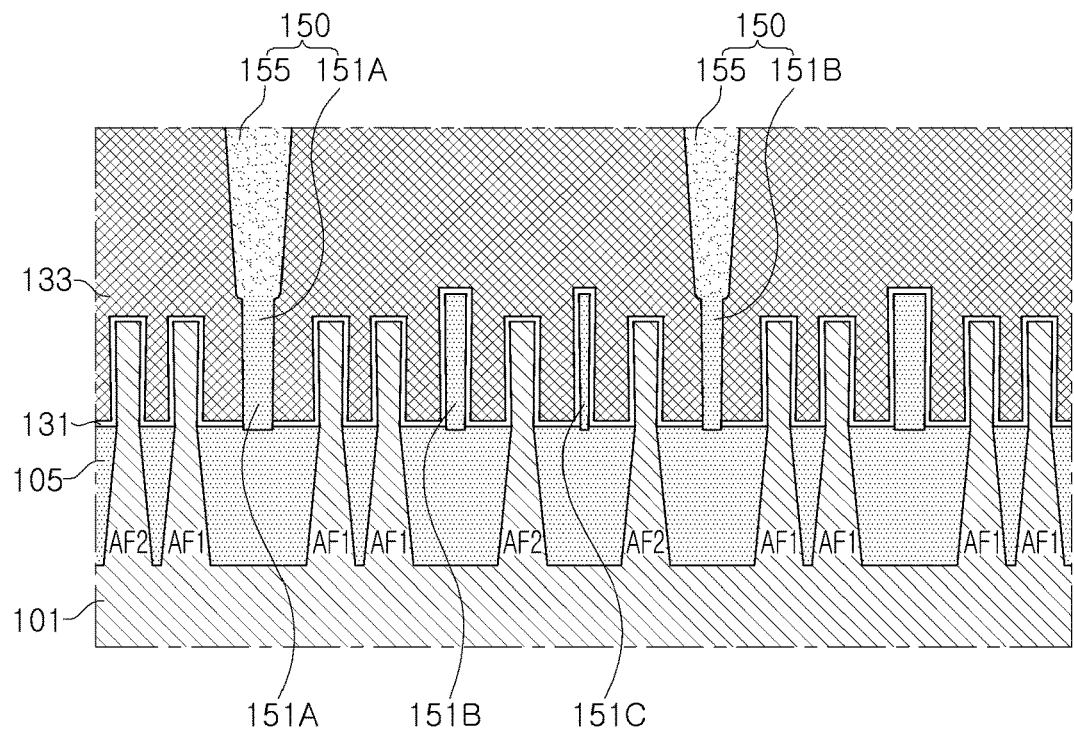
FIGS. 23A and 23B are cross-sectional views taken along line XXIIIA-XXIIIA' and line XXIIIB-XXIIIB' of FIG. 21.
Figure 23B:
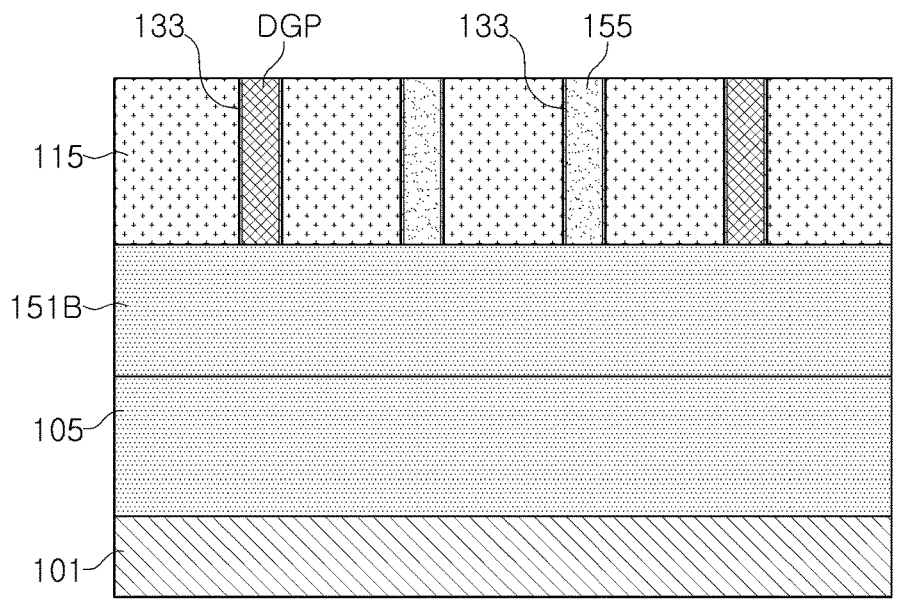

FIGS. 20 and 21 are plan views of processes illustrating a method of manufacturing (replacement process) a semiconductor device, according to an example embodiment, and FIG. 22 is a cross-sectional view taken along line XXII-XXII' of FIG. 20, and FIGS. 23A and 23B are cross-sectional views taken along line XXIIIA-XXIIIA' and line XXIIIB-XXIIIB' of FIG. 21.

Referring to FIGS. 20 and 22, a plurality of dummy gate patterns DGP are formed by patterning a dummy gate structure DG, and an interlayer dielectric layer 115 is provided between the dummy gate patterns such that upper surfaces of the dummy gate patterns DGP are exposed through a polishing process.

The first and second dummy gate material layers DG1 and DG2 are patterned to form a plurality of dummy gate patterns DGP extending in the second direction. A gate spacer 133 may be formed on side surfaces of the plurality of dummy gate patterns DGP, and extend in the second direction D2 from. For example, the gate spacer 133 may include silicon oxide or silicon nitride (e.g., SiN, SiCN, SiON, or SiOCN).

An interlayer insulating layer 115 may be formed to fill a space between the dummy gate pattern DGP, on the side surface of which the gate spacer 133 is provided. For example, the interlayer dielectric layer 115 may include a low dielectric material (e.g., silicon oxide, silicon nitride, silicon oxynitride SiON, SiOCN, or fluorine-doped silicate glass FSG). In some example embodiments, the interlayer dielectric layer 115 may include the same material as the insulating material for the device isolation layer 105.

A planarization process such as an etch-back or a chemical mechanical polishing process is performed to planarize upper surfaces of the dummy gate pattern DGP having the gate spacer 133 and the interlayer insulating layer 115. Thereby, the upper surface of the dummy gate pattern DGP may be exposed.

Referring to FIGS. 23A and 23B, together with FIG. 21, a gate isolation layer 155 is formed in one area of the dummy gate pattern DGP such that the dummy gate pattern DGP is separated.

The present process may be performed using a mask in which gate cut areas are opened such that an isolation hole is formed in adjacent dummy gate patterns DGP. The isolation hole may separate the dummy gate pattern DGP into a plurality of dummy gate patterns (for example, first and second dummy gate patterns). A portion of the first and second insulating barriers 151A and 151B may be exposed through the isolation hole. A gate isolation layer 155 may be formed by filling the isolation hole with an insulating material. The gate isolation layer 155 may be connected to the exposed areas of each of the first and second insulating barriers 151A and 151B to form the gate cut structure 150. For example, the insulating material for the gate isolation layer 155 may be a nitride such as silicon nitride, and may be formed of the same insulating material as the insulating material for the first and second insulating barriers 151A and 151B.

A replacement process may be performed, after forming the gate isolation layer 155. For example, the dummy gate pattern may be removed to expose a portion of the active fin, a gate dielectric film may be formed along at least a portion of the active fin, and the space in which the dummy gate pattern is removed may be filled with a gate electrode material, thereby manufacturing the semiconductor device illustrated in FIGS. 12 to 15B.

Further, an additional interlayer insulating layer may be formed on the interlayer insulating layer so as to cover the upper surface of the gate structure. Then, an adjacent active fin area of the gate structure may be exposed and a source/drain area may be formed. For example, a selective epitaxial growth SEG process may be used to form source/drain areas from active fins. Next, a desired semiconductor device may be manufactured by forming contact plugs connecting to these source/drain areas and gate electrode of the gate structure.

Figure 24:
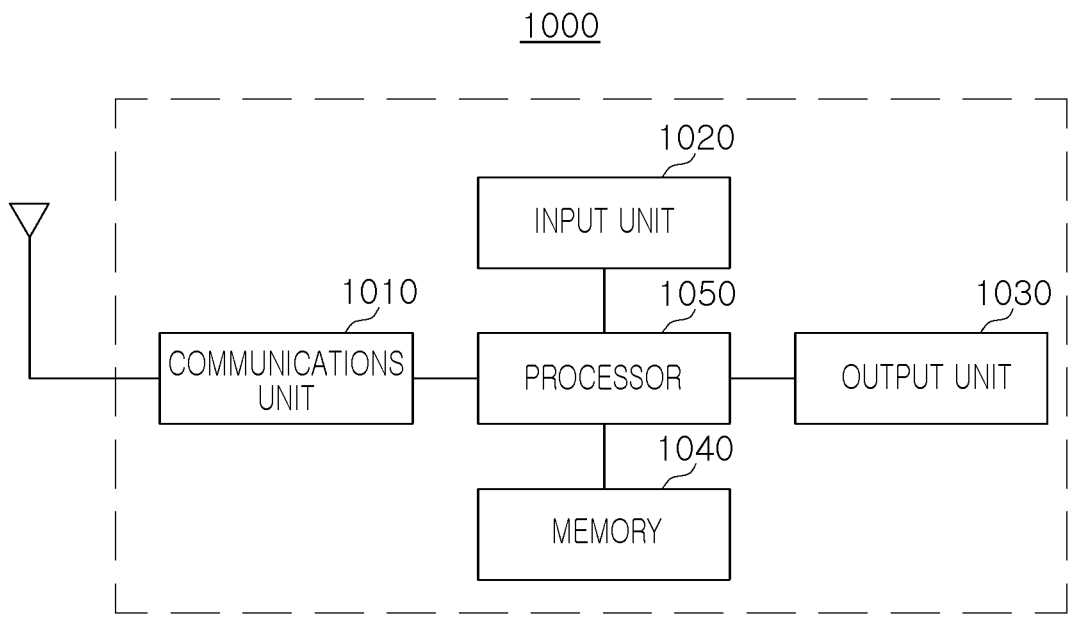
FIG. 24 is a block diagram illustrating an electronic apparatus including a semiconductor device, according to an example embodiment.

FIG. 24 is a block diagram illustrating an electronic apparatus including a semiconductor device, according to an example embodiment.

Referring to FIG. 24, an electronic apparatus 1000 according to the present example embodiment may include a communication unit 1010, an input unit 1020, an output unit 1030, a memory 1040, and a processor 1050.

The communication unit 1010 may include a wired/wireless communication module, a wireless internet module, a short-distance module, a GPS module, a mobile communication module, and the like. The wired/wireless communication module included in the communication unit 1010 may be connected to an external network according to various communication standards to transmit and receive data.

The input unit 1020 may include a mechanical switch, a touch screen, a voice recognition module, and the like, provided by a user to control an operation of the electronic apparatus 1000. In addition, the input unit 1020 may include a mouse, operated by a track ball method, a laser pointer, or the like, or a finger mouse device, and may further include various sensor modules through which a user may input data.

The output unit 1030 may output information processed in the electronic apparatus 1000 in a form of voice or image, and the memory 1040 may store a program, data, or the like for processing and controlling of the processor 1050. The processor 1050 may transfer a command to the memory 1040 according to required operations to store or retrieve data.

The memory 1040 may be embedded in the electronic apparatus 1000 or communicate with the processor 1050 via a separate interface. When communicating with the processor 1050 via the separate interface, the processor 1050 may store or retrieve data to the memory 1040 via various interface standards such as SD, SDHC, SDXC, MICRO SD, USB, and the like.

The processor 1050 controls an operation of each unit included in the electronic apparatus 1000. The processor 1050 may perform controlling and processing related to a voice call, a video call, data communication, and the like, or may perform controlling and processing for multimedia play and management. In addition, the processor 1050 may process an input transferred from a user through the input unit 1020 and output the result through the output unit 1030. In addition, the processor 1050 may store data necessary for controlling the operation of the electronic apparatus 1000 in the memory 1040 or retrieve the data from the memory 1040 as described above. At least one of the processor 1050 and the memory 1040 may include a semiconductor device according to various example embodiments as described above with reference to FIGS. 1 to 5 and FIGS. 12 to 15B.

Figure 25:
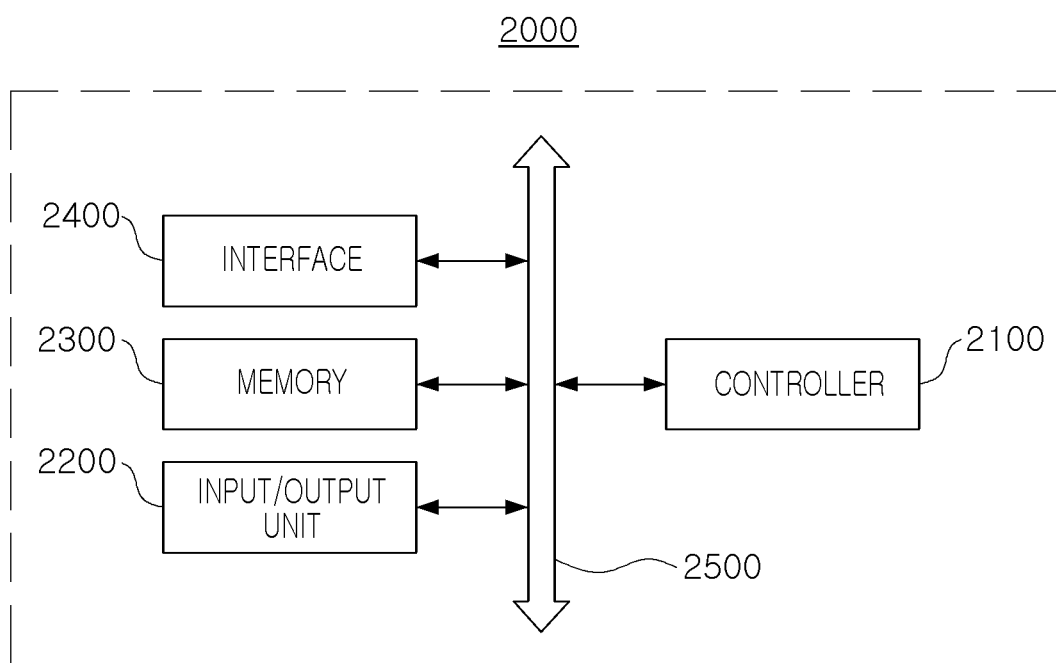
FIG. 25 is a schematic view illustrating a system including a semiconductor device, according to an example embodiment.

FIG. 25 is a schematic diagram illustrating a system including a semiconductor device, according to an example embodiment.

Referring to FIG. 25, a system 2000 may include a controller 2100, an input/output device 2200, a memory 2300, and an interface 2400. The system 2000 may be a system transmitting or receiving a mobile system or information. The mobile system may be a PDA, a portable computer, a web tablet, a wireless phone, a mobile phone, a digital music player, or a memory card.

The controller 2100 may execute a program and control the system 2000. The controller 2100 may be, for example, a microprocessor, a digital signal processor, a microcontroller, or a similar device as described above.

The input/output device 2200 may be used to input or output data of the system 2000. The system 2000 may be connected to an external device, for example, a personal computer or network, using the input/output device 2200 to exchange data with the external device. The input/output device 2200 may be, for example, a keypad, a keyboard, or a display.

The memory 2300 may store code and/or data for the operation of the controller 2100, and/or may store the processed data in the controller 2100.

An interface 2400 may be a data transmission path between the system 2000 and other external devices. The controller 2100, the input/output device 2200, the memory 2300, and the interface 2400 may communicate with each other via a bus 2500.

At least one of the controller 2100 or the memory 2300 may include a semiconductor device according to various example embodiments of the present inventive concepts as described above with reference to FIGS. 1 to 5 and FIGS. 12 to 15B.

As set forth above, according to some example embodiments of the present inventive concepts, a self-alignment process may be used to form an insulating barrier between the active fins before patterning a dummy gate structure, which may be introduced into a lower cut structure. A two-story gate cut structure may be provided by forming an upper cut structure connected to a portion of the insulating barrier after patterning the dummy gate structure. Thus, a patterning limit in a dummy gate cut process in the related art may be overcome, and a yield and characteristics may be substantially improved.

The various advantages and effects of the present inventive concepts are not limited to the above description, and some additional advantages and effect may be ascertained in the course of appreciating the example embodiments described herein.

While some example embodiments have been shown and described above, it will be apparent to those skilled in the art that modifications and variations could be made without departing from the scope of the present inventive concepts as defined by the appended claims.

What is claimed is:

1. A semiconductor device, comprising:
a substrate having a plurality of active fins, each of the plurality of active fins protruding in a direction perpendicular to an upper surface of the substrate and extending in a first direction;
first and second gate structures crossing over the plurality of active fins, the first and second gate structures extending in a second direction different from the first direction;
at least one insulating barrier extending in the first direction and between the plurality of active fins, the at least one insulating barrier separating lower portions of the first and second gate structures from each other; and
a gate isolation layer connected to a portion of the at least one insulating barrier, and separating upper portions of the first and second gate structures from each other, the gate isolation layer having a bottom surface positioned at a level higher than upper surfaces of the plurality of active fins,
wherein the at least one insulating barrier is under the gate isolation layer such that a top surface of the gate isolation layer and a top surface of the at least one insulating barrier are on different levels,
each of the first and second gate structures comprises a gate dielectric film on a portion of each of the plurality of active fins and a gate electrode on the gate dielectric film, and
the gate dielectric film extends to side surfaces of both the at least one insulating barrier and the gate isolation layer such that the gate dielectric film is between the side surfaces and the gate electrode.

2. The semiconductor device of claim 1, wherein the at least one insulating barrier extends to a length corresponding to lengths of adjacent ones of the plurality of active fins.

3. The semiconductor device of claim 1, wherein the at least one insulating barrier has a height greater than heights of the plurality of active fins.

4. The semiconductor device of claim 1, wherein a width of the at least one insulating barrier in the second direction is smaller than a width of the gate isolation layer in the second direction.

5. The semiconductor device of claim 1, wherein each of the at least one insulating barrier and the gate isolation layer has a first width at a bottom surface thereof and a second width at the top surface thereof, and the first width is smaller than the second width.

6. The semiconductor device of claim 1, wherein the plurality of active fins are arranged at a plurality of different intervals, and the at least one insulating barrier comprises a plurality of insulating barriers that have different widths according to respective intervals between corresponding adjacent pairs of the plurality of active fins.

7. The semiconductor device of claim 6, wherein none of the plurality of insulating barriers is present between two neighboring active fins, from among the plurality of active fins, that are arranged at the smallest interval from among the plurality of different intervals.

8. The semiconductor device of claim 6, wherein the plurality of insulating barriers comprise two insulating barriers arranged in the second direction, and each of the two insulating barriers is at an area between two neighboring active fins, from among the plurality of active fins, that are arranged at the largest interval from among the plurality of different intervals.

9. The semiconductor device of claim 1, wherein the at least one insulating barrier comprises a plurality of insulating barriers, and the plurality of insulating barriers have a height greater than heights of the plurality of active fins.

10. The semiconductor device claim 1, wherein each of the first and second gate structures further comprises a gate spacer, which is on both a side surface of each of the first and second gate structures and a side surface of the gate isolation layer, and extends in the second direction.

11. A semiconductor device, comprising:
a substrate having a plurality of active fins each extending in a first direction, the plurality of active fins including first pairs of active fins arranged at a first interval and at least one second pair of active fins arranged at a second interval, the second interval being greater than the first interval;
a first gate structure crossing over a first set of active fins from among the plurality of active fins, a second gate structure crossing over a second set of active fins from among the plurality of active fins, and the first and second gate structures extending in a second direction that is different from the first direction;
at least one insulating barrier between the at least one second pair of the plurality of active fins that is arranged at the second interval, the at least one insulating barrier extending in the first direction and separating lower portions of the first and second gate structures from each other; and
a gate isolation layer on an upper surface of the at least one insulating barrier and separating upper portions of the first and second gate structures from each other, wherein the at least one insulating barrier is under the gate isolation layer such that a top surface of the gate isolation layer and a top surface of the at least one insulating barrier are on different levels,
wherein the at least one second pair of the active fins includes a plurality of second pairs of the active fins, the at least one insulating barrier includes a plurality of the insulating barriers, each being between a corresponding one of the plurality of the second pairs of the active fins, and
the plurality of insulating barriers include an insulating barrier on which the gate isolation layer is not disposed.

12. The semiconductor device of claim 11, wherein the at least one insulating barrier has a length corresponding to lengths of adjacent ones of the plurality of active fins and has a height greater than heights of the plurality of active fins.

13. The semiconductor device of claim 11, wherein a width at the top surface of the at least one insulating barrier is smaller than a width at a bottom surface of the gate isolation layer.

14. The semiconductor device of claim 11, wherein each of the at least one insulating barrier and the gate isolation layer has a first width at a bottom surface thereof and a second width at the top surface thereof, and the first width is smaller than the second width.

15. The semiconductor device of claim 11, wherein the second interval comprises a plurality of different intervals, and the at least one insulating barrier comprises a plurality of insulating barriers that have different widths in proportion to sizes of the plurality of different intervals.

16. The semiconductor device of claim 11, wherein the at least one insulating barrier is not present between each pair of the first pairs of active fins arranged at the first interval.

17. A semiconductor device, comprising:
a substrate having a plurality of active fins, each of the plurality of active fins extending in a first direction, the plurality of active fins including a first set of the plurality of active fins and a second set of the plurality of active fins;
a first gate structure crossing over the first set of the plurality of active fins and a second gate structure crossing over the second set of the plurality of active fins, each of the first and second gate structures extending in a second direction that is different from the first direction; and
a gate cut structure between the first and second gate structures such that the first and second gate structures are separated, the gate cut structure including an insulating barrier and a gate isolation layer, the insulating barrier in the first direction between the first set of the plurality of active fins and the second set of the plurality of active fins, and the gate isolation layer being on an upper surface of the insulating barrier and between the first gate structure and the second gate structure,
wherein the gate isolation layer separates upper portions of the first and second gate structures from each other, and the insulating barrier separates lower portions of the first and second gate structures from each other,
wherein the plurality of active fins are arranged at a plurality of different intervals, and the insulating barrier comprises a plurality of insulating barriers that have different widths according to respective intervals between corresponding adjacent pairs of the plurality of active fins,
wherein each of the first and second gate structures comprises a gate electric film on a portion of each of the plurality of active fins and a gate electrode on the gate dielectric film, and
the gate dielectric film extends to side surfaces of both the insulating barrier.

* * * * *